(12) United States Patent
Hatwar et al.

(10) Patent No.: US 7,531,959 B2
(45) Date of Patent: May 12, 2009

(54) WHITE LIGHT TANDEM OLED DISPLAY WITH FILTERS

(75) Inventors: Tukaram K. Hatwar, Penfield, NY (US); Michael L. Boroson, Rochester, NY (US); Jeffrey P. Spindler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 574 days.

(21) Appl. No.: 11/170,681

(22) Filed: Jun. 29, 2005

(65) Prior Publication Data
US 2007/0001587 A1 Jan. 4, 2007

(51) Int. Cl.
*H01J 29/20* (2006.01)
*H01J 1/62* (2006.01)
*H01L 51/00* (2006.01)
*G09G 3/30* (2006.01)

(52) U.S. Cl. .................. 313/507; 313/505; 313/506; 428/690

(58) Field of Classification Search ......... 313/500–506, 313/512
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,683,823 A | 11/1997 | Shi et al. | |
| 6,107,734 A | 8/2000 | Tanaka et al. | |
| 6,215,244 B1 * | 4/2001 | Kuribayashi et al. | ........ 313/505 |
| 6,337,492 B1 | 1/2002 | Jones et al. | |
| 6,717,358 B1 | 4/2004 | Liao et al. | |
| 6,903,378 B2 | 6/2005 | Cok | |
| 7,227,305 B2 * | 6/2007 | Liu et al. | ................... 313/506 |
| 2003/0189401 A1 | 10/2003 | Kido et al. | |
| 2003/0170491 A1 | 11/2003 | Liao et al. | |

(Continued)

FOREIGN PATENT DOCUMENTS

EP 1339112 8/2003

(Continued)

OTHER PUBLICATIONS

English Abstract of JP 07-142169.

(Continued)

*Primary Examiner*—Sikha Roy
*Assistant Examiner*—Tracie Y Green
(74) *Attorney, Agent, or Firm*—Raymond L. Owens

(57) ABSTRACT

A tandem OLED device having spaced electrodes includes broadband light-emitting units disposed between the electrodes that produce different emission spectra and each light-emitting unit produces light that has multiple spaced peak spectral components, and an intermediate connector disposed between each of the light-emitting units. The device also includes an array of at least three different color filters associated with the device which receives light from the broadband light-emitting units, the band pass of each of the color filters being selected to produce different colored light, wherein the full width at about half maximum of at least one of such spaced peak spectral components produced by each emitting unit is within the band pass of a color filter, and wherein each of the at least three different color filters receives at least one spaced peak spectral component having a full width at about half maximum that is within its band pass.

12 Claims, 14 Drawing Sheets

U.S. PATENT DOCUMENTS

| | | | |
|---|---|---|---|
| 2004/0113875 A1* | 6/2004 | Miller et al. | 345/82 |
| 2005/0040756 A1 | 2/2005 | Winters et al. | |
| 2005/0189875 A1* | 9/2005 | Nakada | 313/504 |
| 2006/0091794 A1 | 5/2006 | Liao et al. | |
| 2006/0261731 A1* | 11/2006 | Aziz et al. | 313/504 |
| 2007/0063638 A1* | 3/2007 | Tokairin et al. | 313/504 |

FOREIGN PATENT DOCUMENTS

| | | |
|---|---|---|
| EP | 1339112 A2 * | 8/2003 |
| WO | 2005-115059 | 12/2005 |

OTHER PUBLICATIONS

English Abstract of JP 2003-045676.
Kido et al. in Applied Physics Letters, 64, 815 (1994).
Deshpande et al. in Applied Physics Letters, 75, 888 (1999).
Matsumoto and Kido et al., reported in SID 03 Digest, 979 (2003).
Tokito, et al. in *Applied Physics Letters*, 83, 2459 (2003).
A Covalently bonded AlQ3/SiO2 hybrid material with blue light emission by a conventional sol-gel approach, H. Zeng, et al, Chem. Commun., 2006, 880-881.

* cited by examiner

WHITE LIGHT TANDEM OLED DISPLAY WITH FILTERS

CROSS REFERENCE TO RELATED APPLICATIONS

Reference is made to commonly assigned U.S. patent application Ser. No. 10/751,352 filed Jan. 5, 2004 by Tukaram K. Hatwar et al. entitled "Improved White OLED Devices With Color Filter Arrays", U.S. patent application Ser. No. 10/838,665 filed May 4, 2004 by Tukaram K. Hatwar et al. entitled "Improved Tuned Microcavity Color OLED Display", U.S. patent application Ser. No. 10/882,834 filed Jul. 1, 2004 by Hatwar et al. entitled "High Performance White Light-Emitting OLED Device", U.S. patent application Ser. No. 10/922,606 filed Aug. 20, 2004 by Liang-Sheng Liao et al. entitled "White OLED Having Multiple White Electroluminescence Units", U.S. patent application Ser. No. 10/970,928 filed Oct. 22, 2004 by Liang-Sheng Liao et al. entitled "White OLEDS With a Color-Compensated Electroluminescent Unit", and U.S. patent application Ser. No. 11/064,386 filed Feb. 23, 2005 by Liang-Sheng Liao et al. entitled "Tandem OLED Having an Organic Intermediate Connector", the disclosures of which are incorporated herein by reference.

FIELD OF THE INVENTION

The present invention relates to broadband light-producing OLED displays with color filters.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a full color display. By broadband emission, it is meant that an OLED emits sufficiently broad light throughout the visible spectrum so that such light is used in conjunction with filters or color change modules to produce displays with at least two different colors or a full color display. In particular, there is a need for broadband-light-emitting OLEDs (or broadband OLEDs) where there is substantial emission in the red, green, and blue portions of the spectrum, i.e., a white light-emitting OLED (white OLED). The use of white OLEDs with color filters provides a simpler manufacturing process than an OLED having separately patterned red, green, and blue emitters. This can result in higher throughput, increased yield, and cost savings. White OLEDs have been reported in the prior art, such as reported by Kido et al. in *Applied Physics Letters*, 64, 815 (1994), J. Shi et al. in U.S. Pat. No. 5,683,823, Sato et al. in *JP* 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited because each type of molecule only emits light with a relatively narrow spectrum under normal conditions. A light-emitting layer having a host material and one or more luminescent dopant(s) can achieve light emission from both the host and the dopant(s) resulting in a broadband emission in the visible spectrum if the energy transfer from the host material to the dopant(s) is incomplete. To achieve a white OLED having a single light-emitting layer, the concentrations of light-emitting dopants need to be carefully controlled. This produces manufacturing difficulties. A white OLED having two or more light-emitting layers can have better color as well as better luminance efficiency than a device with one light, and the dopant concentration variability tolerance is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks. It is known to use a third light-emitting layer to provide a third intensive emission peak, but it becomes difficult to balance the recombination of holes and electrons in these three layers to provide balanced emission.

For certain applications, e.g. televisions, color reproduction is very important. Not only is it important to have effective efficiency, but the color purity of light after passing through a filter needs to be excellent. This is achieved through the use of very narrow band pass color filters. Unfortunately, this wastes a large portion of the emitted light resulting in very low power efficiency. Typically, color filters are designed to have relatively broadband pass. Quite commonly, the band pass of color filters for display applications overlap in certain portions of the spectrum. For example, the blue and green filters can both permit some light in the blue-green portion. This greatly enhances the brightness of light passing through the filter, but it also can lead to unwanted color contamination resulting in desaturated primary colors.

Recently, a tandem OLED structure (sometimes called a stacked OLED or cascaded a OLED) has been disclosed by Jones et al. in U.S. Pat. No. 6,337,492, Tanaka et al. in U.S. Pat. No. 6,107,734, Kido et al. in JP Patent Publication 2003/045676A and in U.S. Patent Publication 2003/0189401 A1, and Liao et al. in U.S. Pat. No. 6,717,358 and U.S. Patent Application Publication 2003/0170491 A1, the disclosures of which are herein incorporated by reference. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

Matsumoto and Kido et al. reported in *SID 03 Digest*, 979 (2003) that a tandem white OLED is constructed by connecting a greenish blue EL unit and an orange EL unit in the device, and white light emission is achieved by driving this device with a single power source. Although luminance efficiency is increased, this tandem white OLED device has weaker green and red color components in the spectrum. In U.S. Patent Application Publication 2003/0170491 A1, Liao et al. describe a tandem white OLED structure by connecting a red EL unit, a green EL unit, and a blue EL unit in series within the device. When the tandem white OLED is driven by a single power source, white light emission is formed by spectral combination from the red, green, and blue EL units. Although color emission and luminance efficiency is improved, this tandem white OLED cannot be made with less than three EL units, implying that it requires a drive voltage at least 3 times as high as that of a conventional OLED. In addition, it is known that blue light-emitting OLED units are not as stable as white light-emitting units. U.S. Pat. No. 6,903,378 discloses a tandem OLED having two white light-emitting EL units and color filters. However, there is no disclosure about how one selects the OLED materials or filters to produce improved performance.

A need exists for displays that are simple to make, but also have effective color gamut and high efficiency.

SUMMARY OF THE INVENTION

It is an object of the present invention to produce a more effective OLED display.

This object is achieved by a tandem OLED device having at least two spaced electrodes comprising:

a) at least two broadband light-emitting units disposed between the electrodes which produce different emission spectra and each light-emitting unit produces light that has two or more spaced peak spectral components;

b) an intermediate connector disposed between each of the light-emitting units; and c) an array of at least three different color filters associated with the device which receives light from the broadband light-emitting units, the band pass of each of the color filters being selected to produce different colored light, wherein the full width at about half maximum of at least one of such spaced peak spectral components produced by each emitting unit is within the band pass of a color filter, and wherein each of the at least three different color filters receives at least one spaced peak spectral component having a full width at about half maximum that is within its band pass.

ADVANTAGES

It has been found that by using a tandem OLED display with red, green, and blue color filters, the light produced by the light-emitting units is selected to correspond to the filters and produce an effective OLED display. It is a further advantage of the present invention that it provides for a device with improved color gamut and improved power efficiency. It is a still further advantage of the present invention that the location of the broadband light-emitting units is selected within the OLED device to increase the amount of light extracted from the OLED device. It is a further advantage of the present invention that the lifetime of an OLED display is improved.

Since device feature dimensions such as layer thicknesses are frequently in submicrometer ranges, the drawings are scaled for ease of visualization rather than dimensional accuracy.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors are produced by appropriate mixing. However, the use of additional colors to extend the color gamut of the device is possible. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. For low power consumption, it is often advantageous for the chromaticity of the white light-emitting OLED to be close to CIE $D_{65}$, i.e., CIE x=0.31 and CIE y=0.33. This is particularly the case for so-called RGBW displays having red, green, blue, and white pixels. Although CIEx, CIEy coordinates of about 0.31, 0.33 are ideal in some circumstances, the actual coordinates can vary significantly and still be very useful.

Figure 1:
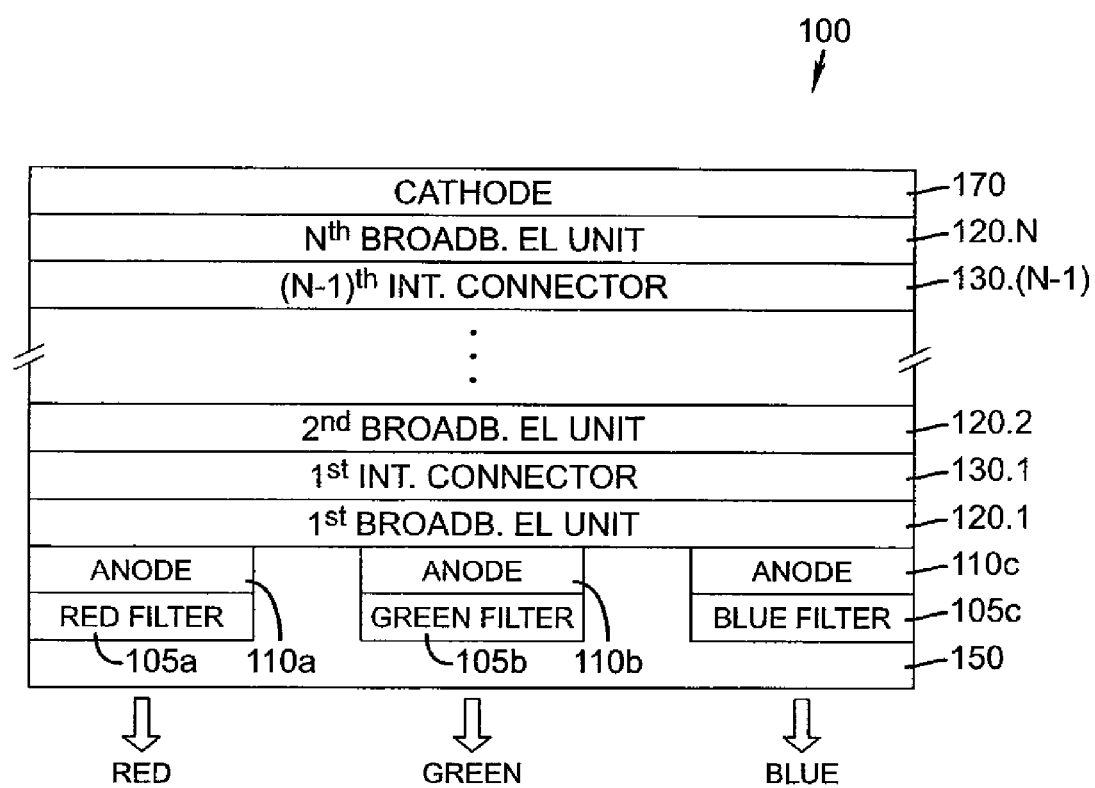
FIG. 1 shows a schematic cross-sectional view of a tandem white OLED with N(N≧2) broadband EL units and an array of color filters in accordance with the present invention.

Turning now to FIG. 1, there is shown a cross-sectional view of one embodiment of a tandem OLED display 100 for producing broadband light in accordance with the present invention. This tandem OLED display has at least two spaced electrodes, here an array of anodes (represented by anodes 110a, 110b, and 110c) and a cathode 170. Either the cathode or the array of anodes, or both, are light transmissive. Disposed between the anode and the cathode are N organic broadband light-emitting units 120.x (indicated as "broadband EL unit"), where N is at least two, and where two or more of the broadband light-emitting units produce different emission spectra. Tandem OLED display 100 also includes N−1 intermediate connectors 130.x (indicated as "int. connector" in the figure) disposed between each of the broadband light-emitting units. x is an integer variable between 1 and N for 120.x and between 1 and N−1 for 130.x. The broadband light-emitting units 120.x, stacked and connected serially, are designated 120.1 to 120.N where 120.1 is the first broadband light-emitting unit (adjacent to the anode), 120.2 is the second broadband light-emitting unit, and 120.N is the $N^{th}$ broadband light-emitting unit (closest to the cathode). The term 120.x represents any of the broadband light-emitting units named from 120.1 to N in the present invention. The intermediate connectors 130.x are disposed between each of the broadband light-emitting units and are designated 130.1 to 130.(N−1) where 130.1 is the first intermediate connector disposed between broadband light-emitting units 120.1 and 120.2, and 130.(N−1) is the last intermediate connector disposed between broadband light-emitting units 120.(N−1) and 120.N. The term 130.x represents any of the intermediate connectors named from 130.1 to 130.(N−1) in the present invention. There are a total of N−1 intermediate connectors associated with N broadband light-emitting units.

The tandem OLED display 100 is externally connected to a voltage/current source through electrical conductors (not shown) and is operated by applying an electric potential produced by a voltage/current source between a pair of contact electrodes, e.g. anode 110a and cathode 170. Under a forward bias, this externally applied electrical potential is distributed among the 2N broadband light-emitting units and the 2N−1 intermediate connectors in proportion to the electrical resistance of each of these units and layers. The electric potential across the tandem white OLED causes holes (positively charged carriers) to be injected from anode 110a into the $1^{st}$ broadband light-emitting unit 120.1, and electrons (negatively charged carriers) to be injected from cathode 170 into the $N^{th}$ broadband light-emitting unit 120.N. Simultaneously, electrons and holes are produced in, and separated from, each of the intermediate connectors, (130.1-130.(N−1)). Electrons thus produced, for example in intermediate connector 130.1, are injected towards the anode and into the adjacent broadband light-emitting unit 120.1. Likewise, holes produced in the intermediate connector 130.1 are injected towards the cathode and into the adjacent broadband light-emitting unit 120.2. Subsequently, these electrons and holes recombine in their corresponding light-emitting units to produce light. Although only emissive under forward bias, it has been shown in the prior art that driving the OLED using an alternating bias can sometimes improve the lifetime.

An array of at least three different color filters is associated with tandem OLED display 100. The array of color filters receives light from the broadband light-emitting units. The band pass of each of the color filters is selected to produce different colored light. The band pass of a color filter is defined as the range of wavelengths wherein the transmittance of light is at least 50% of the maximum transmittance by the filter. Although the array of color filters can have a variety of color filter combinations, a useful combination includes filters of the three primary colors, that is red filter 105a whose band pass is selected to permit red light to pass, green filter 105b whose band pass is selected to permit green light to pass, and blue filter 105c whose band pass is selected to permit blue light to pass, so that the array of color filters can produce a wide gamut of colors, including white light. For example, if a current passes between anode 110a and cathode 170, broadband light will be produced that will be filtered by red filter 105a, thus producing red light to the observer. Several types of color filters are known in the art. One type of color filter is formed on a second transparent substrate and then aligned with the pixels of the first substrate 150. An alternative type of color filter is formed directly over the elements of a pixel as in FIG. 1. In a display comprising multiple pixels, the space between the individual color filter elements can also be filled with a black matrix to reduce pixel crosstalk and improve the display's contrast.

Figure 2:
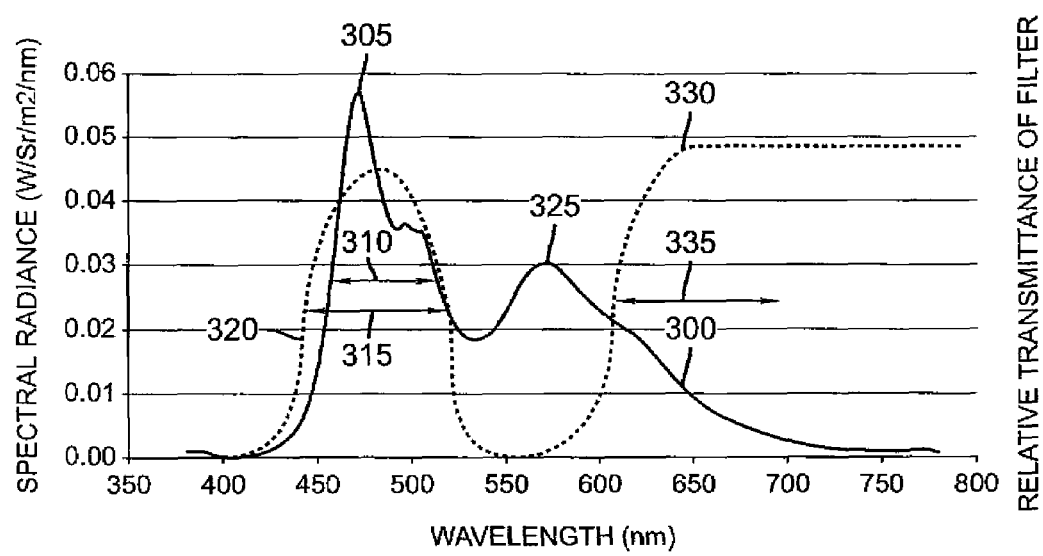
FIG. 2 shows a color filter transmittance spectrum showing its band pass, and an emission spectrum showing a full width at half maximum for emission peaks.

The relationship between the band pass of the color filter and the emission is shown schematically in FIG. 2. A broadband light-emitting unit can have emission spectrum 300, which has two peak spectral components 305 and 325. The full width at half maximum 310 is defined as the range of emission at greater than one-half the maximum value of peak spectral component 305. A first color filter can have transmittance spectrum 320. Band pass 315 is the portion of transmittance spectrum 320 that is greater than or equal to one-half of the maximum transmittance of the color filter. In some cases, a so-called one-sided filter is used. For example, transmittance spectrum 330 of a second color filter has a transmittance limit at the shorter wavelength end, but not at the longer wavelength end within the limit of visible light. For this filter, the band pass 335 will be from the one-half maximum transmittance on the shorter-wavelength side (e.g. about 610 nm in this example) to the limit of light visible to the human eye, about 700 nm. The broadband light-emitting units are selected to each produce light that has two or more spaced peak spectral components, such as peak spectral components 305 and 325, wherein the full width at about half maximum of at least one of such spaced peak spectral components produced by each emitting unit (e.g. full width at half maximum 310 of peak spectral component 305) is within the band pass of a color filter (e.g. band pass 315). The broadband light-emitting units are further selected so that each of the different color filters receive at least one spaced peak spectral component for which its full width at about half maximum is within the band pass of any particular color filter. In FIG. 2, one can see that peak spectral component 325 does not fall within the band pass of the first or second color filter. Thus, another broadband emitting EL unit (not shown) is required that will have such peak component within the band pass of the second color filter.

In one embodiment, a first broadband light-emitting unit produces peak spectral components whose full width at half maximum corresponds to two of the color filters, e.g. blue and red, and a second broadband light-emitting unit produces peak spectral components whose full width at half maximum corresponds to the third color filter, e.g. green, and to either the first or second color filter. In a second embodiment, a first broadband light-emitting unit produces peak spectral components whose full width at half maximum corresponds to each of the red, green, and blue color filters, and a second broadband light-emitting unit produces peak spectral components whose full width at half maximum corresponds to two different color filters, e.g. red and blue. In another embodiment, two broadband light-emitting units produce peak spectral components whose full width at half maximum corresponds to each of the red, green, and blue filters. By the use of red, green, and blue color filters and peak spectral components corresponding to these color filters, white light and full color images are produced by the OLED display.

It is further desirable that the spaced spectral components whose full widths at half maximum correspond to each color filter have substantial emission intensity. That is, it is desirable to have at least one strong peak corresponding to each of the red, green, and blue colors, for which the full widths at half maximum correspond to the red, green, and blue filters. "Substantial emission" means that such strong peaks are all within a factor of 4 of each other in terms of spectral radiance intensity. Preferably, they are within a factor of 3.

It is also desirable that the combined emission spectrum of the tandem OLED that results from the combined emission spectra of all of the light-emitting units has reduced emission intensities in the wavelength ranges near the band pass of each color filter. "Reduced emission intensities" means that the spectral radiance intensities are less than 66% of the peak spectral radiance intensities of the corresponding color. Preferably, the spectral radiance intensities are less than 50% of the peak spectral radiance intensities of the corresponding color. "Near the band pass" means within +/−5 nm of the wavelength at which the color filter has transmittance equal to one-half of the maximum transmittance of the color filter. Preferably, "near the band pass" is within +/−10 nm of the wavelength at which the color filter has transmittance equal to one-half of the maximum transmittance of the color filter. For example, in FIG. 2 it is desirable that the emission spectrum has reduced emission intensity at the upper blue filter band pass of 520 nm (less than 50% of the peak blue spectral radiance intensity), but not as desirable that the emission spectrum does not have reduced emission intensity at the lower red filter band pass of 605 nm.

Each broadband light-emitting unit (sometimes called an EL unit) in the tandem OLED display 100 is capable of supporting hole transport, electron transport, and electron-hole recombination to produce light. Typically, each light-emitting unit can include a plurality of layers. There are many organic light-emitting multilayer structures known in the art that are used as the broadband EL unit of the present invention. These include hole-transporting layer (HTL)/one or more light-emitting layers (LEL or LELs)/electron-transporting layer (ETL), hole-injecting layer (HIL)/HTL/(LEL or LELs)/ETL, HIL/HTL/(LEL or LELs)/ETL/electron-injecting layer (EIL), HIL/HTL/electron-blocking layer or hole-blocking layer/(LEL or LELs)/ETL/EIL, and HIL/HTL/(LEL or LELs)/hole-blocking layer/ETL/EIL. At least two of the broadband light-emitting unit in the tandem OLED display are different from each other so that the combined emission provides improved performance.

The layer structure of the $1^{st}$ EL unit adjacent to the anode preferably is of HIL/HTL/(LEL or LELs)/ETL, and the layer structure of the $N^{th}$ EL unit adjacent to the anode preferably is of HTL/(LEL or LELs)/ETL/EIL, and the layer structure of the other EL units preferably is of HTL/(LEL or LELs)/ETL. In some instances, when the thickness of the LEL adjacent to the ETL is thicker than 20 nm, the ETL is simply replaced by an EIL, and the EIL then serves the function of supporting both electron injection and electron transportation.

Considering the number of the LELs within a specific broadband light-emitting unit in the tandem OLED display 100, the number of LELs is typically from 1 to 3. Therefore, in one embodiment the broadband light-emitting unit can include at least one HTL and three LELs, wherein each of the LELs has different color emission. The broadband light-emitting unit can also include at least one HTL and two LELs, wherein each of the LELs has different color emission. In certain useful embodiments, one LEL has as hole transporting material as the main host and the second LEL has an electron transporting or bipolar material as the main host. Alternatively, broadband light-emitting unit can also include at least one HTL and one LEL having broadband emission. The light-emitting layers are selected such that each broadband light-emitting unit produces light that has two or more spaced peak spectral components in more than a single region of the visible spectrum, e.g. blue and green, or blue and red. At least two broadband light-emitting units have different color emission spectra, but there are some common spectral features. For example, a first broadband light-emitting unit can have a red-light-emitting layer and a green-light-emitting layer and a second broadband light-emitting unit can have a green-light-emitting layer and a blue-light-emitting layer. The two green-light-emitting layers or materials are the same or different.

Each broadband light-emitting unit is selected in order to improve performance or achieve a desired attribute. In particular each is selected in order to provide at least one suitable emission peak that is matched to a color filter. Further considerations when selecting broadband EL units include drive voltage, luminance efficiency, manufacturability, and device stability. Due to optical effects, broadband light-emitting units and their location in the tandem stack are individually selected to increase the amount of light extracted from the OLED device. The number of broadband light-emitting units in the tandem OLED display is equal to or more than 2.

In order to reduce drive voltage for the tandem OLED display, it is desirable to make each light-emitting unit as thin as possible without compromising the electroluminescence efficiency. It is preferable that each light-emitting unit is less than 500 nm thick, and more preferable that it be 2-250 nm thick. It is also preferable that each layer within the light-emitting unit be 200 nm thick or less, and more preferable that it be 0.1-100 nm. It is also preferable that the thickness of each LEL in the light-emitting unit be in the range of from 5 nm to 50 nm.

Figure 3:
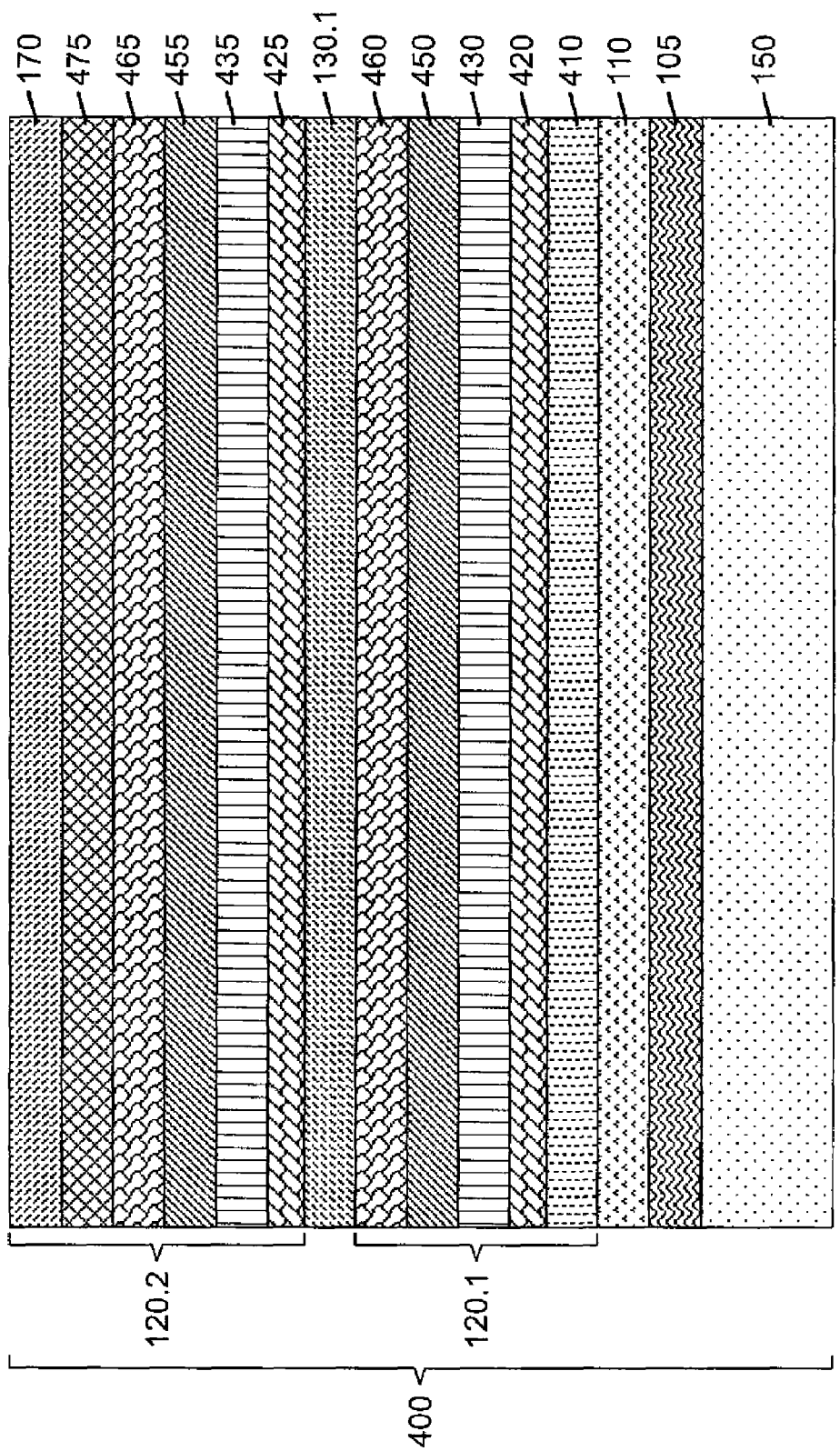
FIG. 3 shows a cross-sectional view of a single light-emitting pixel of a tandem OLED display according to the present invention.

Turning now to FIG. 3, there is shown a cross-sectional view of a single light-emitting pixel 400 of a tandem OLED display according to the present invention. Light-emitting pixel 400 is drawn as bottom-emitting, but it is top-emitting or bottom-emitting. Light-emitting pixel 400 includes a substrate 150, an anode 110, a cathode 170 spaced from anode 110, a first broadband light-emitting unit 120.1, a intermediate connector 130.1, a second broadband light-emitting unit 120.2 that is different from 120.1, and a color filter 105. Each broadband light-emitting unit includes one or more light-emitting layers (e.g. light-emitting layers 430, 450, 435, and 455) and can also include a hole-injecting layer (e.g. 410), a hole-transporting layer (e.g. 420 and 425), an electron-transporting layer (e.g. 460 and 465), and an electron-injecting layer (e.g. 475). The materials for these layers are described below.

Broadband EL units such as 120.1 produce light in response to hole-electron recombination. Desired organic light-emitting materials are deposited by any suitable method such as evaporation, sputtering, chemical vapor deposition, electrochemical deposition, or radiation thermal transfer from a donor material. Useful organic light-emitting materials are well known. As more fully described in U.S. Pat. Nos. 4,769,292 and 5,935,721, the light-emitting layers of the organic EL element include a luminescent or fluorescent material where electroluminescence is produced as a result of electron-hole pair recombination in this region. Although OLED light-emitting layers are formed from light-emitting material, they more generally include a host-material and a light-emitting dopant. Certain red-, yellow-, green-, and blue-light-emitting compounds are particularly useful for the present invention. Prior art displays which emit white light include emitting layers that produce a wide range of emitted wavelengths, e.g. EP 1 187 235 A2, which teaches a white light-emitting organic electroluminescent element with a substantially continuous spectrum in the visible region of the spectrum. Other examples are described in, for example EP 1 187 235, US 2002/0025419, EP 1 182 244, U.S. Pat. Nos. 5,683,823, 5,503,910, 5,405,709, and 5,283,182. These will be referred to herein as broadband white emitters or broadband emitters.

The HTL contains at least one hole-transporting material such as an aromatic tertiary amine, where the aromatic tertiary amine is understood to be a compound containing at least one trivalent nitrogen atom that is bonded only to carbon atoms, at least one of which is a member of an aromatic ring.

In one form the aromatic tertiary amine is an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described by VanSlyke et al. in U.S. Pat. Nos. 4,720,432 and 5,061,569. The HTL is formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4', 1'':4''',1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl(NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4''-diamino-p-terphenyl;
4,4'-Bis {N-phenyl-N-[4-(1-naphthyl)-phenyl]amino}biphenyl;
2,6-Bis[N,N-di(2-naphthyl)amino]fluorene;
4,4',4''-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Tertiary aromatic amines with more than two amino groups are used including oligomeric materials. In addition, polymeric hole-transporting materials are used such as poly (N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The LEL includes a luminescent fluorescent or phosphorescent material where electroluminescence is produced as a result of electron-hole pair recombination in this region. The light-emitting layer includes a single material, but more commonly contains a host material doped with a guest emitting material or materials where light emission comes primarily from the emitting materials and is of any color. This guest emitting material is often referred to as a light-emitting dopant. The host materials in the light-emitting layer are an electron-transporting material, as defined below, a hole-transporting material, as defined above, or another material or combination of materials that support hole-electron recombination. The emitting material is typically chosen from highly fluorescent dyes and phosphorescent compounds, e.g. transition metal complexes as described in WO 98/55561, WO 00/18851, WO 00/57676, and WO 00/70655. Emitting materials are typically incorporated at 0.01 to 10% by weight of the host material.

The host and emitting materials are small nonpolymeric molecules or polymeric materials including polyfluorenes and polyvinylarylenes, e.g., poly(p-henylenevinylene), PPV. In the case of polymers, small molecule emitting materials are molecularly dispersed into a polymeric host, or the emitting materials are added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, U.S. Patent Application Publications 2002/0127427 A1, 2003/0198829 A1, 2003/0203234 A1, 2003/0224202 A1, and 2004/0001969 A1.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias,tris(8-quinolinolato)aluminum(III)];
CO-2: Magnesium bisoxine[alias,bis(8-quinolinolato)magnesium(II)];
CO-3: Bis[benzo{f}-8-quinolinolato]zinc (II);
CO-4: Bis(2-methyl-8-quinolinolato)aluminum(III)-m-oxo-bis(2-methyl-8-quinolinolato) aluminum(III);
CO-5: Indium trisoxine[alias,tris(8-quinolinolato)indium];
CO-6: Aluminum tris(5-methyloxine)[alias,tris(5-methyl-8-quinolinolato) aluminum(III)];
CO-7: Lithium oxine[alias,(8-quinolinolato)lithium(I)];
CO-8: Gallium oxine[alias,tris(8-quinolinolato)gallium (III)]; and
CO-9: Zirconium oxine[alias,tetra(8-quinolinolato)zirconium(IV)].

Another class of useful host materials includes derivatives of anthracene, such as those described in U.S. Pat. Nos. 5,935, 721, 5,972,247, 6,465,115, 6,534,199, 6,713,192, U.S. Patent Application Publications 2002/0048687 A1, 2003/0072966 A1, and WO 2004/018587 A1. Some examples include derivatives of 9,10-dinaphthylanthracene derivatives and 9-naphthyl-10-phenylanthracene. Other useful classes of host materials include distyrylarylene derivatives as described in U.S. Pat. No. 5,121,029, and benzazole derivatives, for example, 2,2',2"-(1,3,5-phenylene)tris[1-phenyl-1H-benzimidazole].

Desirable host materials are capable of forming a continuous film. The light-emitting layer can contain more than one host material in order to improve the device's film morphology, electrical properties, light emission efficiency, and lifetime. Mixtures of electron-transporting and hole-transporting materials are known as useful hosts. In addition, mixtures of the above listed host materials with hole-transporting or electron-transporting materials can make suitable hosts. Mixtures of anthracene derivatives with arylamine derivatives are particularly useful hosts.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrilium compounds, fluorene derivatives, periflanthene derivatives, indenoperylene derivatives, bis(azinyl)amine boron compounds, bis(azinyl)methane boron compounds, derivatives of distryrylbenzene and distyrylbiphenyl, and carbostyryl compounds. Among derivatives of distyrylbenzene, particularly useful are those substituted with diarylamino groups, informally known as distyrylamines.

Suitable host materials for phosphorescent emitters (including materials that emit from a triplet excited state, i.e., so-called "triplet emitters") should be selected so that the triplet exciton is transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles, and carbazole compounds. Examples of desirable hosts are 4,4'-N,N'-dicarbazole-biphenyl(CBP), 2,2'-dimethyl-4,4'-N,N'-dicarbazole-biphenyl, m-(N,N'-dicarbazole)benzene, and poly(N-vinylcarbazole), including their derivatives.

Examples of useful phosphorescent materials that are used in light-emitting layers of the present invention include, but are not limited to, those described in WO 00/57676 A1, WO 00/70655 A1, WO 01/41512 A1, WO 02/15645 A1, WO 01/93642 A1, WO 01/39234 A2, WO 02/074015 A2, WO 02/071813 A1, U.S. Pat. Nos. 6,458,475, 6,573,651, 6,451,455, 6,413,656, 6,515,298, 6,451,415, 6,097,147, U.S. Patent Application Publications 2003/0017361 A1, 2002/0197511 A1, 2003/0072964 A1, 2003/0068528 A1, 2003/0124381 A1, 2003/0059646 A1, 2003/0054198 A1, 2002/0100906 A1, 2003/0068526 A1, 2003/0068535 A1, 2003/0141809 A1, 2003/0040627 A1, 2002/0121638 A1, EP 1 239 526 A2, EP 1 238 981 A2, EP 1 244 155 A2, JP 2003073387A, JP 2003073388A, JP 2003059667A, and JP 2003073665A. Useful phosphorescent dopants include, but are not limited to, transition metal complexes, such as iridium and platinum complexes.

In the present invention, at least EL units emit broadband light, for example white light. Multiple dopants are added to one or more layers in order to produce a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. Nos. 5,683,823, 5,503,910, 5,405,709, 5,283,182, 6,627,333, 6,696,177, 6,720,092, U.S. Patent Application Publications 2002/0186214 A1, 2002/0025419 A1, and 2004/0009367 A1. In preferred embodiments, broadband light is produced by multiple LELs. In some of these systems, the host for one light-emitting layer is a hole-transporting material.

It has been found useful that a red-light-emitting compound have a peak spectral component between 560 nm and 640 nm (depending on the red color filter), and that the red light produced by the red-light-emitting compound have a full width at half maximum of 5 to 90 nm, preferably less than 40 nm. By peak spectral component is meant a wavelength of maximum emission, also called $\lambda_{max}$ (e.g. 305 in FIG. 2). By full width at half maximum is meant the width of a given emission peak at one-half its maximum value, e.g. full width at half maximum 310 in FIG. 2. Preferably, the peak spectral component is between 600 and 640 nm. The red-light-emitting compound can include a diindenoperylene compound of the following structure:

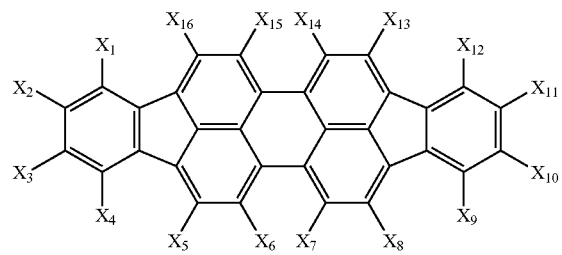

A1 wherein:

$X_1$-$X_{16}$ are independently selected as hydrogen or substituents that include alkyl groups of from 1 to 24 carbon atoms;

aryl or substituted aryl groups of from 5 to 20 carbon atoms;

hydrocarbon groups containing 4 to 24 carbon atoms that complete one or more fused aromatic rings or ring systems, or halogen.

Illustrative examples of useful red dopants of this class include the following:

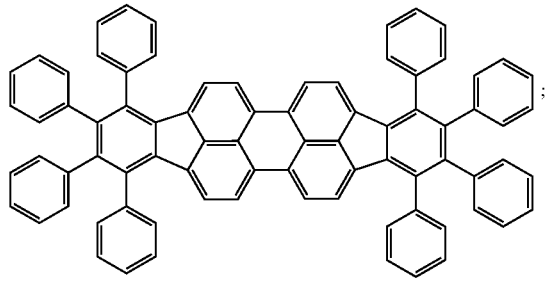

A3

-continued

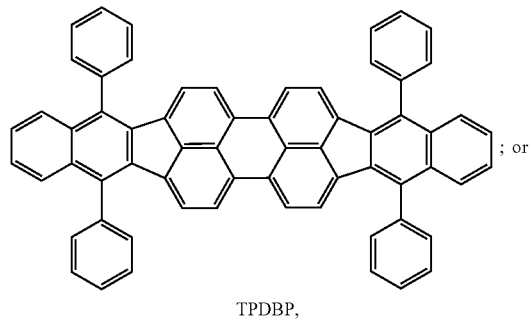
TPDBP,

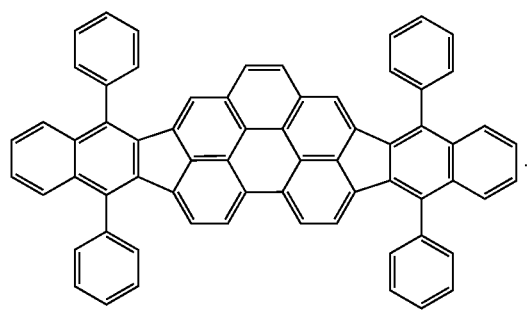

A particularly preferred diindenoperylene dopant is TPDBP (A4 above). Other red dopants useful in the present invention belong to the DCM class of dyes represented by:

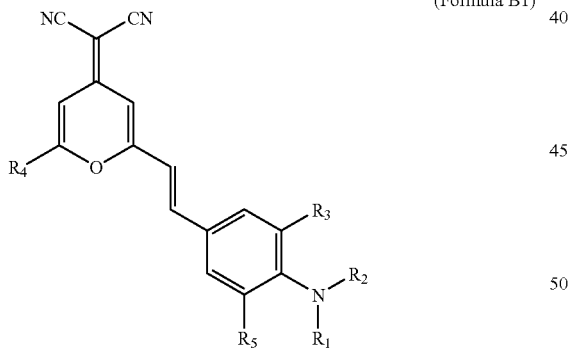
(Formula B1)

wherein:
R$_1$-R$_5$ represent one or more groups independently selected from hydro, alkyl, substituted alkyl, aryl, or substituted aryl; and
R$_1$-R$_5$ independently include acyclic groups or are joined pairwise to form one or more fused rings; provided that R3 and R5 do not together form a fused ring.

In a useful and convenient embodiment that provides red luminescence, R$_1$-R$_5$ are selected independently from: hydro, alkyl and aryl. Structures of particularly useful dopants of the DCM class are shown below:

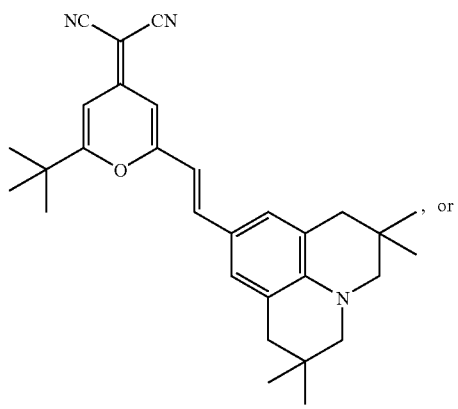
DCJTB;

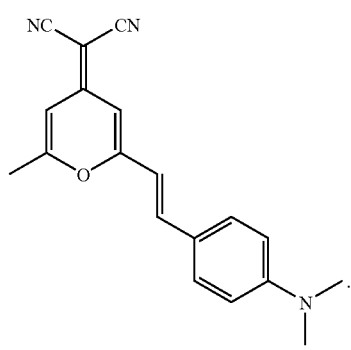

A preferred DCM dopant is DCJTB. Hatwar et al. in U.S. patent application Ser. No. 10/751,352 filed Jan. 5, 2004 have disclosed other DCM dopants useful for broadband emission. The red dopant can also be a mixture of compounds that would also be red dopants individually.

Certain orange or yellow light-emitting materials are useful, such as compounds of the following structures:

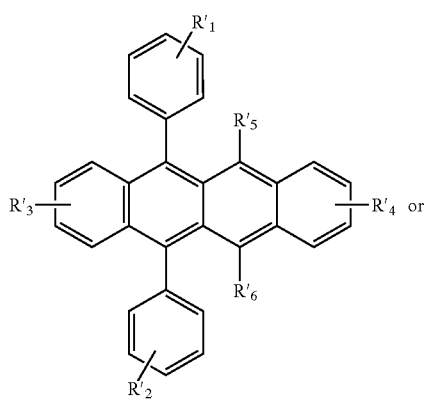

-continued

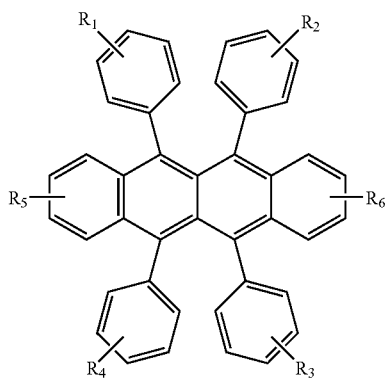

C2

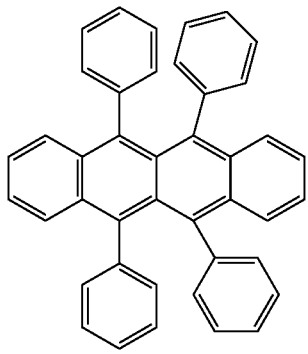

(Rubrene, C3);

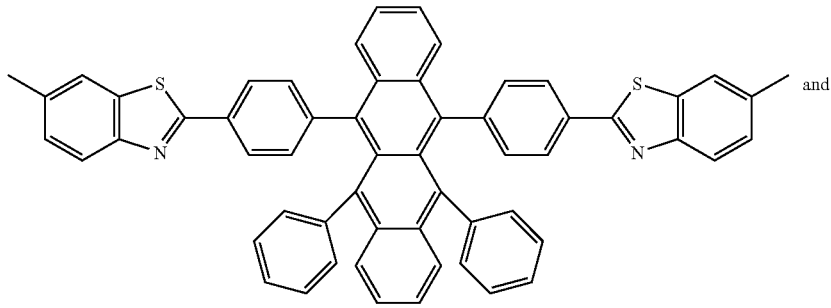

(DBzR, C4);

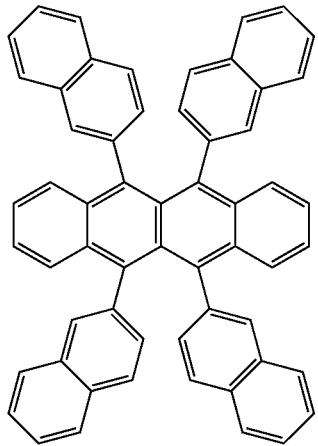

(NR, C5), wherein $R_1$-$R_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful dopants of this class are shown below:

and

-continued

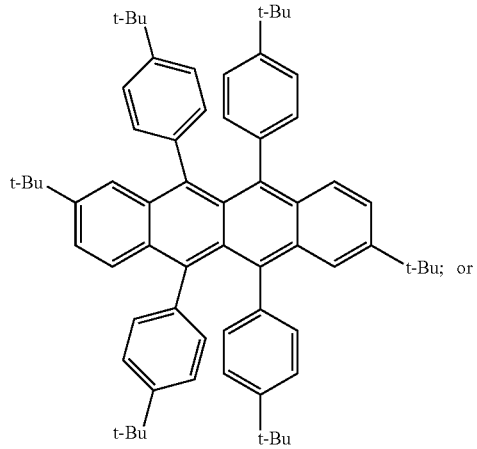

C6

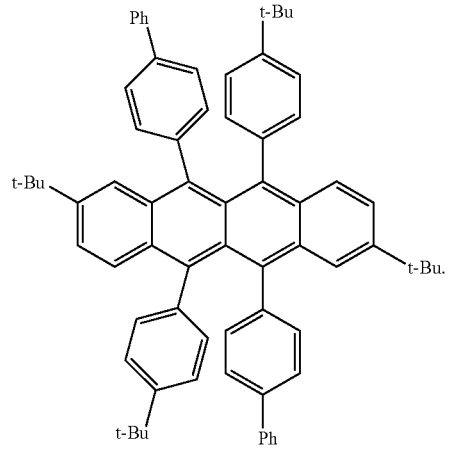

C7

It has been found useful that a green-light-emitting compound have a peak spectral component between 510 and 540 nm (depending on the green color filter), and that the green light produced by the green-light-emitting compound have a full width at half maximum of about 40 nm or less. The green-light-emitting compound can include a quinacridone compound of the following structure:

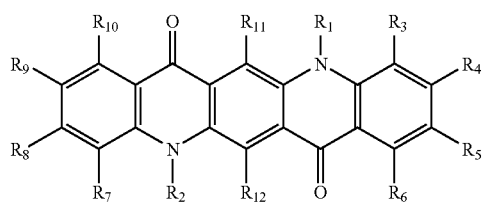

D1 wherein substituent groups $R_1$ and $R_2$ are independently alkyl, alkoxyl, aryl, or heteroaryl; and substituent groups $R_3$ through $R_{12}$ are independently hydrogen, alkyl, alkoxyl, halogen, aryl, or heteroaryl, and adjacent substituent groups $R_3$ through $R_{10}$ can optionally be connected to form one or more ring systems, including fused aromatic and fused heteroaromatic rings, provided that the substituents are selected to provide an emission maximum between 510 nm and 540 nm, and a full width at half maximum of 40 nm or less. Alkyl, alkoxyl, aryl, heteroaryl, fused aromatic ring and fused heteroaromatic ring substituent groups are further substituted. Conveniently, $R_1$ and $R_2$ are aryl, and $R_2$ through $R_{12}$ are hydrogen, or substituent groups that are more electron withdrawing than methyl. Some examples of useful quinacridones include those disclosed in U.S. Pat. No. 5,593,788 and in U.S. Patent Application Publication 2004/0001969 A1.

Examples of useful quinacridone green dopants include:

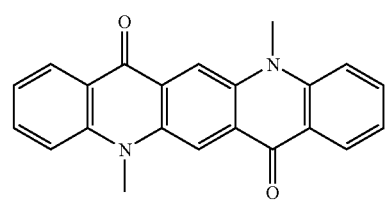

D2

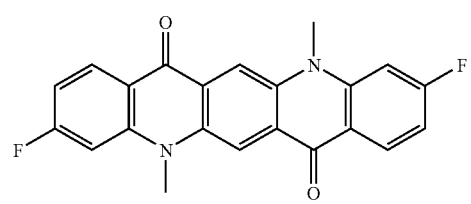

D3

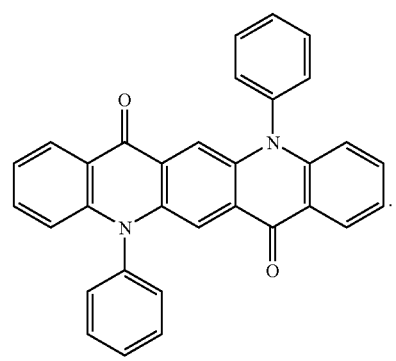

D4

The green-light-emitting compound can include a coumarin compound of the following structure:

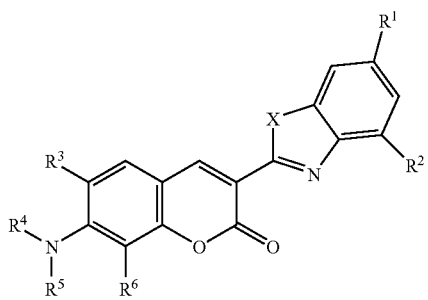

E1

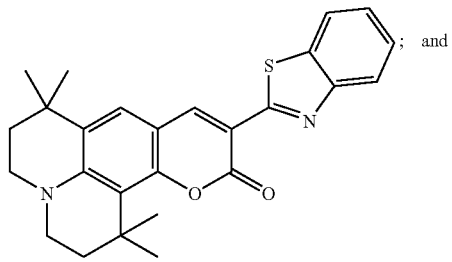

E4 wherein:

X is O or S, R¹, R², R³ and R⁶ can individually be hydrogen, alkyl, or aryl;

R⁴ and R⁵ can individually be alkyl or aryl, or where either R³ and R⁴, or R⁵ and R⁶, or both together represent the atoms completing a cycloalkyl group, provided that the substituents are selected to provide an emission maximum between 510 nm and 540 nm, and a full width at half maximum of 40 nm or less.

Examples of useful coumarin green dopants include:

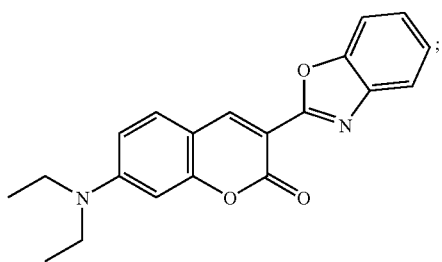

E2

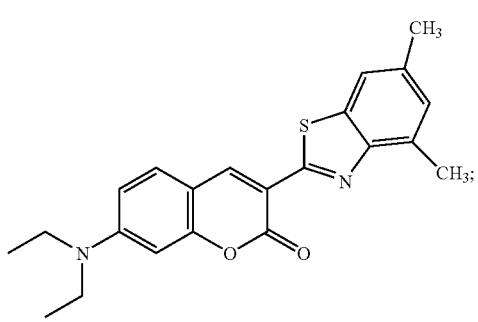

E3

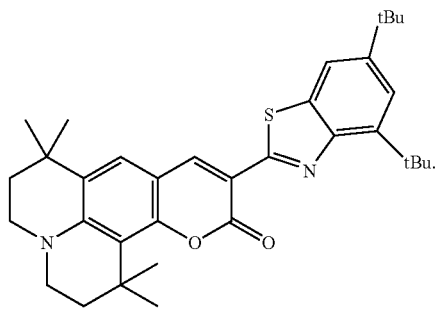

E5

It has been found useful that a blue-light-emitting compound have a peak spectral component between 450 nm and 480 nm (depending on the blue filter), and that the blue light produced by the blue-light-emitting compound have a full width at half maximum of 20 nm or less. The blue-light-emitting compound can include a bis(azinyl)azene boron complex compound of the structure F1:

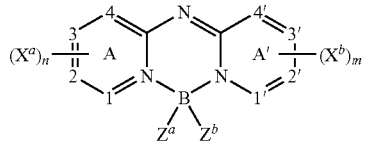

F1 wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide an emission maximum between 450 nm and 480 nm, and a full width at half maximum of 20 nm or less.

Some examples of the above class of dopants include the following:

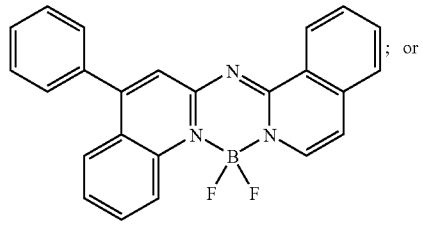

; or (BEP).

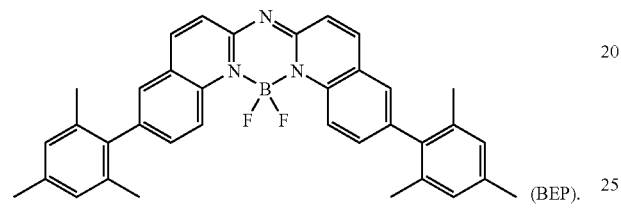

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure shown below:

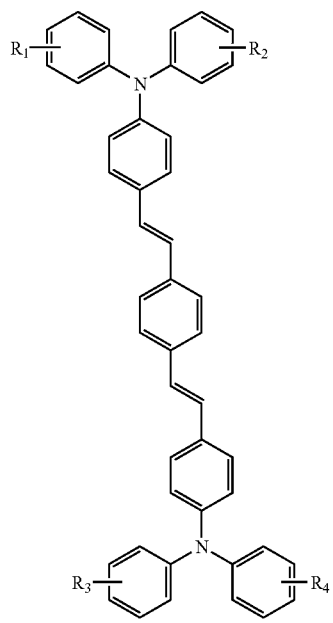

and bis[2-[4-[N,N-diarylamino]phenyl]vinyl]biphenyls of the general structure shown below:

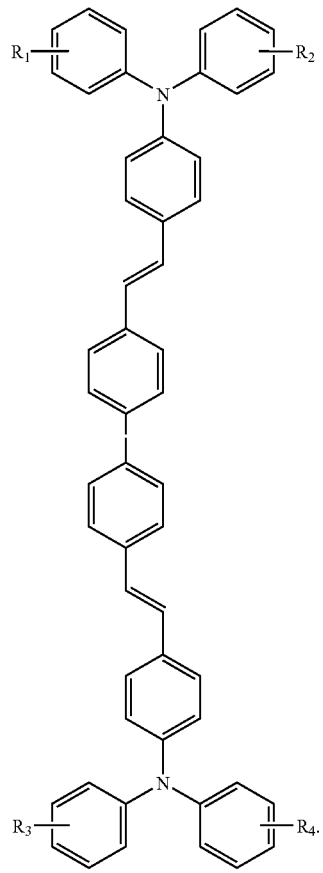

In Formulas G1 and G2, $R_1$-$R_4$ are the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly preferred blue dopant of this class is 1,4-bis[2-[4-[N,N-di(p-tolyl)amino]phenyl]vinyl]benzene (BDTAPVB, Formula G3 below).

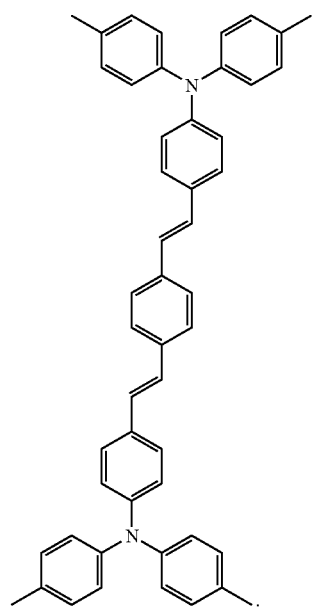

Another particularly useful class of blue dopants includes perylene or derivatives of perylene, including, but not limited to, the following:

H1
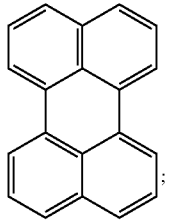

H2
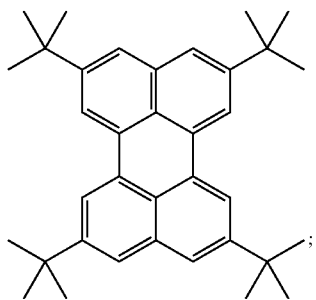

H3
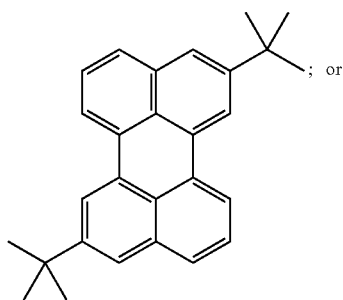; or

H4
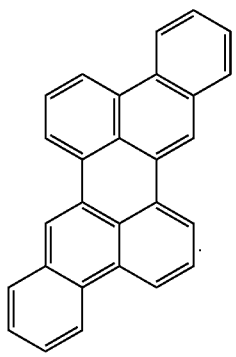

The host material in one or more of the light-emitting layers of the present invention is an anthracene derivative having hydrocarbon or substituted hydrocarbon substituents at the 9 and 10 positions. For example, derivatives of 9,10-di-(2-naphthyl)anthracene (Formula J1) constitute one class of useful host materials capable of supporting electroluminescence, and are particularly suitable for light emission of wavelengths longer than 400 nm, e.g., blue, green, yellow, orange or red

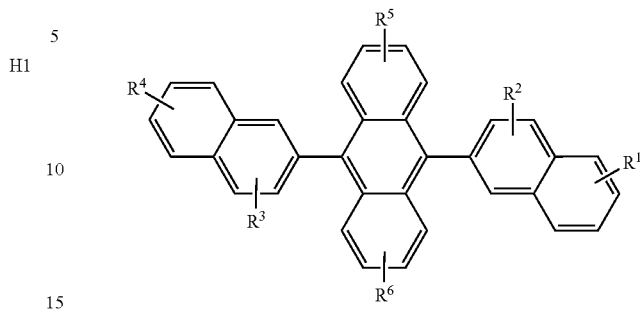
(J1)

wherein $R^1$, $R^2$, $R^3$, $R^4$, $R^5$, and $R^6$ represent one or more substituents on each ring where each substituent is individually selected from the following groups:
  Group 1: hydrogen, or alkyl of from 1 to 24 carbon atoms;
  Group 2: aryl or substituted aryl of from 5 to 20 carbon atoms;
  Group 3: carbon atoms from 4 to 24 necessary to complete a fused aromatic ring of anthracenyl, pyrenyl, or perylenyl;
  Group 4: heteroaryl or substituted heteroaryl of from 5 to 24 carbon atoms as necessary to complete a fused heteroaromatic ring of furyl, thienyl, pyridyl, quinolinyl or other heterocyclic systems;
  Group 5: alkoxylamino, alkylamino, or arylamino of from 1 to 24 carbon atoms; and
  Group 6: fluorine, chlorine, bromine or cyano.

The monoanthracene derivative of Formula (J2) is also a useful host material capable of supporting electroluminescence, and are particularly suitable for light emission of wavelengths longer than 400 nm, e.g., blue, green, yellow, orange or red. Anthracene derivatives of Formula (J2) are described in commonly assigned U.S. patent application Ser. No. 10/950,614 filed Sep. 27, 2004 by Lelia Cosimbescu et al., entitled "Electroluminescent Device With Anthracene Derivative Host", the disclosure of which is herein incorporated by reference,

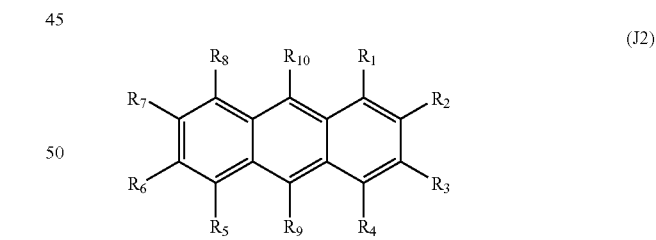
(J2)

wherein:
  $R_1$-$R_8$ are H;
  $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula:

A1-L-A2    (J3)

wherein A 1 and A 2 each represent a substituted or unsubstituted monophenylanthryl group or a substituted or unsubstituted diphenylanthryl group and are the same with or different from each other and L represents a single bond or a divalent linking group.

Another useful class of anthracene derivatives is represented by general formula:

A3-An-A4    (J4)

wherein:
  An represents a substituted or unsubstituted divalent anthracene residue group; and
  A 3 and A 4 each represent a substituted or unsubstituted monovalent condensed aromatic ring group or a substituted or unsubstituted noncondensed ring aryl group having 6 or more carbon atoms and are the same with or different from each other. Specific examples of useful anthracene materials for use in a light-emitting layer include:

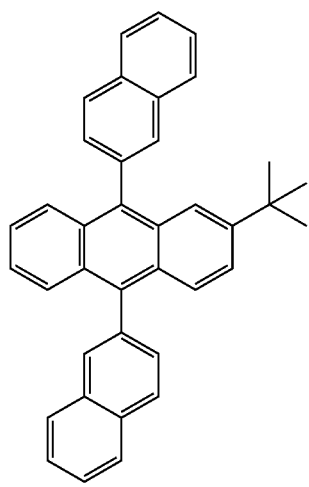

AH1

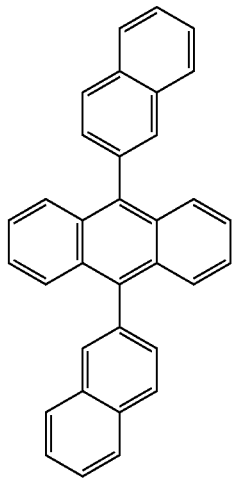

AH2

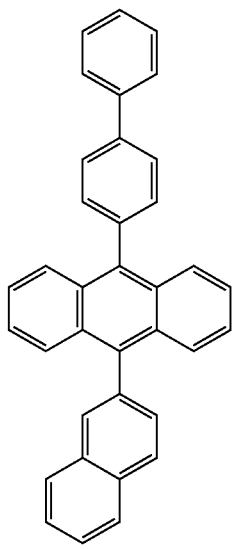

AH3

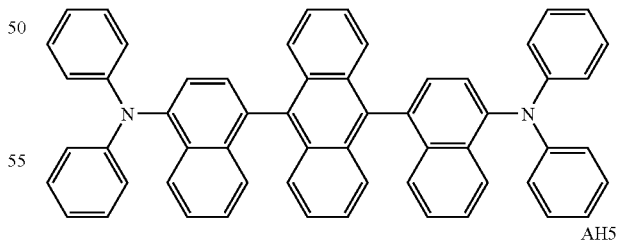

AH4

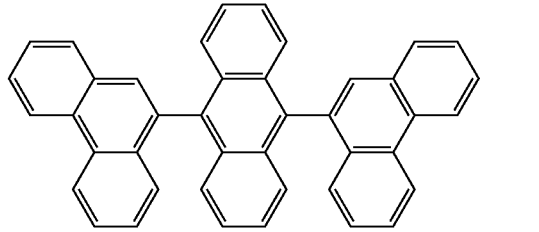

AH5

-continued

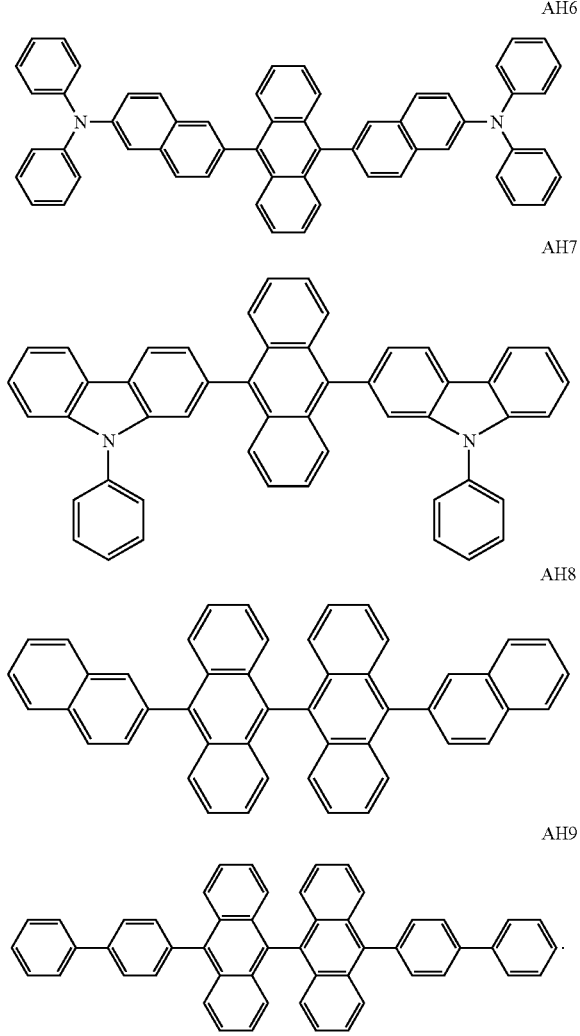

AH6

AH7

AH8

AH9

The ETL can contain one or more metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds have been listed above from CO-1 to CO-9.

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

For a tandem OLED to function efficiently, it is preferable that an intermediate connector be provided between organic EL units. The intermediate connector provides effective carrier injection into the adjacent EL units. Metals, metal compounds, or other inorganic compounds are effective for carrier injection. However, such materials often have low resistivity, which can result in pixel crosstalk. Also, the optical transparency of the layers constituting the intermediate connector should be as high as possible to permit for radiation produced in the EL units to exit the device. Therefore, it is often preferred to use mainly organic materials in the intermediate connector. There are several useful configurations for the intermediate connector. Some nonlimiting examples of intermediate connectors are described in U.S. Pat. Nos. 6,717,358 and 6,872,472, and U.S. Patent Application Publication 2004/0227460 A1.

Preferably, intermediate connector includes an n-type doped organic layer or a p-type doped organic layer or both. One useful intermediate connector has two layers including an n-type doped organic layer and an electron-accepting layer. The electron-accepting layer is disposed closer to the cathode than the n-type doped organic layer. These two layers are in contact, or an interfacial layer can separate them. The intermediate connector can include a p-type doped organic layer disposed over the electron-accepting layer. The p-type doped organic layer is closer to the cathode than the electron-accepting layer. In this configuration, the p-type doped organic layer is preferably in contact with the electron-accepting layer. The intermediate connector can have both an interfacial layer and a p-type doped organic layer. Alternatively, the intermediate connector can include: an n-type doped organic layer adjacent to a p-type doped organic layer; an n-type doped organic layer and an interfacial layer; an n-type doped organic layer, an interfacial layer, and an p-type doped organic layer.

The n-type doped organic layer contains at least one electron-transporting material as a host material and at least one n-type dopant. The term "n-type doped organic layer" means that this layer has semiconducting properties after doping, and the electrical current through this layer is substantially carried by the electrons. The host material is capable of supporting electron injection and electron transport. The electron-transporting materials defined previously for use in the ETL represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang in U.S. Pat. No. 4,356,429, various heterocyclic optical brighteners as disclosed by VanSlyke et al. in U.S. Pat. No. 4,539,507, triazines, hydroxyquinoline derivatives, benzazole derivatives, and phenanthroline derivatives. Silole derivatives, such as 2,5-bis(2',2"-bipridin-6-yl)-1,1-dimethyl-3,4-diphenyl silacyclopentadiene are also useful host organic materials. In some instances it is useful to combine two or more hosts to obtain the proper charge injection and stability properties. More specific examples of useful host materials in the n-type organic doped layer include Alq, 4,7-diphenyl-1,10-phenanthroline (Bphen), or 2,9-dimethyl-4,7-diphenyl-1,10-phenanthroline (BCP), or combinations thereof.

The n-type dopant in the n-type doped organic layer includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped organic layer also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant is any of the above or also a material molecularly dispersed or copolymerized with the host as a minor component. Preferably, the n-type dopant in the n-type doped organic layer includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20% by volume. The thickness of the n-type doped organic layer is typically less than 200 nm, and preferably less than 100 nm.

The electron-accepting layer (if used) of the intermediate connector includes one or more organic materials, each having an electron-accepting property and a reduction potential greater than −0.5 V vs. a Saturated Calomel Electrode (SCE), and wherein the one or more organic materials provide more than 50% by volume in the intermediate connector. Preferably, the electron-accepting layer includes one or more organic materials having a reduction potential greater than −0.1 V vs. SCE. More preferably, the electron-accepting layer includes a single organic material having an electron-accepting property and a reduction potential greater than −0.1 V vs. SCE. By "electron-accepting property" it is meant that the organic material has the capability or tendency to accept at least some electronic charge from other type of material that it is adjacent.

The electron-accepting layer, including one or more organic materials having a reduction potential greater than −0.5 V vs. SCE and providing more than 50% by volume in the electron-accepting layer, can have both effective carrier injection and effective optical transparency in the tandem OLED. Organic materials suitable for use in the electron-accepting layer include not only simple compounds containing at least carbon and hydrogen, but also include metal complexes, e.g., transition metal complexes having organic ligands and organometallic compounds, as long as their reduction potentials are more positive than −0.5 V vs. SCE. Organic materials for the electron-accepting layer can include small molecules (capable of being deposited by vapor deposition), polymers, or dendrimers, or combinations thereof. Electron accepting layers are most effective when at least a portion of the electron-accepting layer does not significantly mix with adjacent layers. This is accomplished by choosing materials having molecular weight high enough to prevent such diffusion. Preferably, the molecular weight of the electron-accepting material is greater than 350. To maintain the proper electron-accepting properties of the layer, it is desirable that the one or more organic materials constitute more than 90% by volume of the electron-accepting layer. For manufacturing simplicity, a single compound is used for the electron-accepting layer.

Some examples of organic materials having a reduction potential greater than −0.5 V vs. SCE that are used to form the electron-injecting layer include, but are not limited to, derivatives of hexaazatriphenylene and tetracyanoquinodimethane. A useful thickness of the electron-accepting layer is typically between 3 and 100 nm.

The term "p-type doped organic layer" means that the organic layer has semiconducting properties after doping, and the electrical current through this layer is substantially carried by the holes. When used in the present invention, the optional p-type doped organic layer contains at least one organic host material and one p-type dopant, wherein the organic host material is capable of supporting hole transport. The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Other suitable triarylamines substituted with one or more vinyl radicals or comprising at least one active hydrogen-containing group are disclosed by Brantley et al. in U.S. Pat. Nos. 3,567,450 and 3,658,520. A more preferred class of aromatic tertiary amines are those which include at least two aromatic tertiary amine moieties as described by VanSlyke et al. in U.S. Pat. Nos. 4,720,432 and 5,061,569. Nonlimiting examples include as N,N'-di(naphthalene-1-yl)-N,N'-diphenyl-benzidine (NPB) and N,N'-diphenyl-N,N'-bis(3-methylphenyl)-1, 1-biphenyl-4,4'-diamine(TPD), and N,N,N',N'-tetranaphthyl-benzidine (TNB). Another preferred class of aromatic amines are dihydrophenazine compounds as described in commonly assigned U.S. patent application Ser. No. 10/390, 973 filed Mar. 18, 2003 by Kevin P. Klubek et al., entitled "Cascaded Organic Electroluminescent Devices", the disclosure of which is herein incorporated by reference. The combination of the aforementioned materials is also useful to form the p-typed doped organic layer. More preferably, the organic host material in the p-type doped organic layer includes NPB, TPD, TNB, 4,4',4"-tris(N-3-metylphenyl-N-phenyl-amino)-triphenylamine(m-MTDATA), 4,4',4"-tris(N, N-diphenyl-amino)-triphenylamine(TDATA), or dihydrophenazine compounds, or combinations thereof.

The p-type dopant in the p-type doped organic layer includes oxidizing agents with strong electron-withdrawing properties. "Strong electron-withdrawing properties" means that the organic dopant should be able to accept some electronic charge from the host to form a charge-transfer complex with the host material. Some nonlimiting examples include organic compounds such as 2,3,5,6-tetrafluoro-7,7,8,8-tetracyanoquinodimethane ($F_4$-TCNQ) and other derivatives of 7,7,8,8-tetracyanoquinodimethane (TCNQ), and inorganic oxidizing agents such as iodine, $FeCl_3$, $FeF_3$, $SbCl_5$, some other metal chlorides, and some other metal fluorides. The combination of p-type dopants is also useful to form the p-type doped organic layer. The p-type doped concentration is preferably in the range of 0.01-20 vol. %. The thickness of the p-type doped organic layer is typically less than 150 nm, and preferably in the range of about 1 to 100 nm.

The host materials used in the intermediate connectors can include small molecule materials or polymeric materials, or combinations thereof. In some instances, the same host material is used for both n-type and p-type doped organic layers, provided that it exhibits both hole and electron transport properties set forth above. Examples of materials that are used as host for either the n-type or p-type doped organic layers include, but are not limited to, various anthracene derivatives as described in U.S. Pat. No. 5,972,247, certain carbazole derivatives such as 4,4-bis(9-dicarbazolyl)-biphenyl(CBP), and distyrylarylene derivatives such as 4,4'-bis(2, 2'-diphenyl vinyl)-1,1'-biphenyl, and as described in U.S. Pat. No. 5,121,029.

A p-type doped organic layer can form at the interface of the electron-accepting layer and the HTL simply by deposition of the HTL material. In the present invention, the materials chosen for the electron-accepting layer and the HTL are such that only a small amount of mixing occurs. That is, it is important that at least some of the electron-accepting layer does not mix with the HTL material.

When used in the present invention, the optional interfacial layer in the intermediate connector is mainly used to stop the possible inter-diffusion between materials of the various layers within the intermediate connector. The interfacial layer is a metal compound or a metal. When used, the layer should be as thin as possible to be effective, reduce optical losses, and prevent unwanted pixel crosstalk if the interfacial layer is conductive or semiconductive.

The interfacial layer can contain a metal compound selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The interfacial layer can contain a metal compound selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric tellurides or nonstoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The interfacial layer 332 can contain a metal compound selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. Particularly useful metal compounds for use in the interfacial layer are selected from $MoO_3$, $NiMoO_4$, $CuMoO_4$, $WO_3$, ZnTe, $Al_4C_3$, $AlF_3$, $B_2S_3$, CuS, GaP, InP, or SnTe. Preferably, the metal compound is selected from $MoO_3$, $NiMoO_4$, $CuMoO_4$, or $WO_3$.

When using a metal compound, the thickness of the interfacial layer in the intermediate connector is in the range of from 0.5 nm to 20 nm.

Alternatively, the interfacial layer can include a high work function metal layer. The high work function metal used to form this layer has a work function no less than 4.0 eV and includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer includes Ag, Al, Cu, Au, Zn, In, or Sn, or combinations thereof. More preferably, the high work function metal includes Ag or Al.

When using a high work function metal, the thickness of the interfacial layer in the intermediate connector is in the range of from 0.1 nm to 5 nm.

The overall thickness of the intermediate connectors is typically from 5 nm to 200 nm. If there are more than two intermediate connectors in a tandem OLED, the intermediate connectors are the same or different from each other in terms of layer thickness, material selection, or both.

Each of the layers in the EL unit is formed from small molecule OLED materials, or polymeric LED materials, or combinations thereof. Some EL units are polymeric and other units are small molecules (or nonpolymeric), including fluorescent materials and phosphorescent materials. The corresponding layer in each of the EL units in the tandem OLED is formed using the same or different materials from those of the other corresponding layers, and can have the same or different layer thicknesses.

As mentioned previously, it is often useful to provide a hole-injecting layer (HIL) between the anode and the HTL. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, some aromatic amines, for example, m-MTDATA (4,4',4"-tris[(3-methylphenyl)phenyl-amino]triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1. p-Type doped organic materials as described previously for use in the intermediate connector are also a useful class of hole-injecting materials. Hexaazatriphenylene derivatives are also useful HIL materials, as described in U.S. Pat. No. 6,720,573. A particularly useful HIL material is shown below

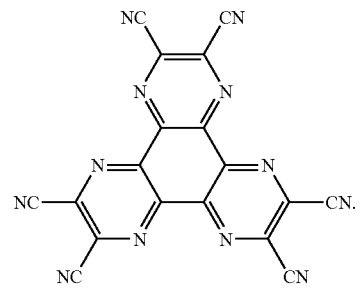

Formuala M1

It is often useful to provide an electron-injecting layer (EIL) between the cathode and the ETL. n-Type doped organic layers as described previously for use in the intermediate connector are a useful class of electron-injecting materials.

The OLED of the present invention is typically provided over a supporting substrate 150 where either the cathode or anode are in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore is light transmissive, light-absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through the anode 11, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material is used, regardless if it is transparent, opaque, or reflective. Example conductors for the present invention include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes are patterned using well known photolithographic processes. Optionally, anodes are polished prior to the deposition of other layers to reduce surface roughness so as to reduce electrical shorts or enhance reflectivity.

When light emission is viewed solely through the anode, the cathode used in the present invention includes nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material includes an MgAg alloy wherein the percentage of silver is in the range of 1 to 20% by atomic ratio, as described in U.S. Pat. No. 4,885,211. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work function metal or metal salt and, if so, the thicker capping layer does not need to have a low work function. One such cathode includes a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368. Cathode materials are typically deposited by thermal evaporation, electron beam evaporation, ion sputtering, or chemical vapor deposition. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

The organic materials mentioned above are suitably deposited through a vapor-phase method such as sublimation, but are deposited from a fluid, for example, from a solvent with an optional binder to improve film formation. If the material is a polymer, solvent deposition is useful but other methods are used, such as sputtering or thermal transfer from a donor sheet. The material to be deposited by sublimation is vaporized from a sublimation "boat" often includes a tantalum material, e.g., as described in U.S. Pat. No. 6,237,529, or is first coated onto a donor sheet and then sublimed in closer proximity to the substrate. Layers with a mixture of materials can use separate sublimation boats or the materials are pre-mixed and coated from a single boat or donor sheet. Patterned deposition is achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover is attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various well known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light-emitting areas of the display. Filters, polarizers, and anti-glare or anti-reflection coatings can also be provided over a cover or as part of a cover.

White or broadband emission are combined with color filters to provide full color or multicolor display. The color filters can include red, green, and blue filters. The present invention is suitably used in displays having four differently colored pixels, for example, red, green, blue, and white emitting pixels (RGBW) as described in U.S. Patent Application Publication 2004/0113875 A1. When the white emitting pixel is substantially not filtered, although it can have some small amount of filtering to trim the color or incidental filtering that might occur due to encapsulation layers or the like provided over the white pixel. In place of white, yellow or cyan are used. Five or more color systems can also be useful.

The OLED device can have a microcavity structure. In one useful example, one of the metallic electrodes is essentially opaque and reflective; the other one is reflective and semi-transparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length is tuned by selecting the thickness of the organic layers or by placing a transparent optical spacer between the electrodes. For example, an OLED device of the present invention can have ITO spacer layer placed between a reflective anode and the organic EL media, with a semitransparent cathode over the organic EL media.

The present invention is employed in most OLED device applications. These include very simple structures comprising a single anode and cathode to more complex devices, such as area color displays, passive matrix displays including orthogonal arrays of anodes and cathodes to form pixels, and active matrix displays where each pixel is controlled independently, for example, with thin film transistors (TFTs). The present invention can also be employed for devices where the OLED is used as a light source, for example, in backlights for LCD displays.

Figure 4:
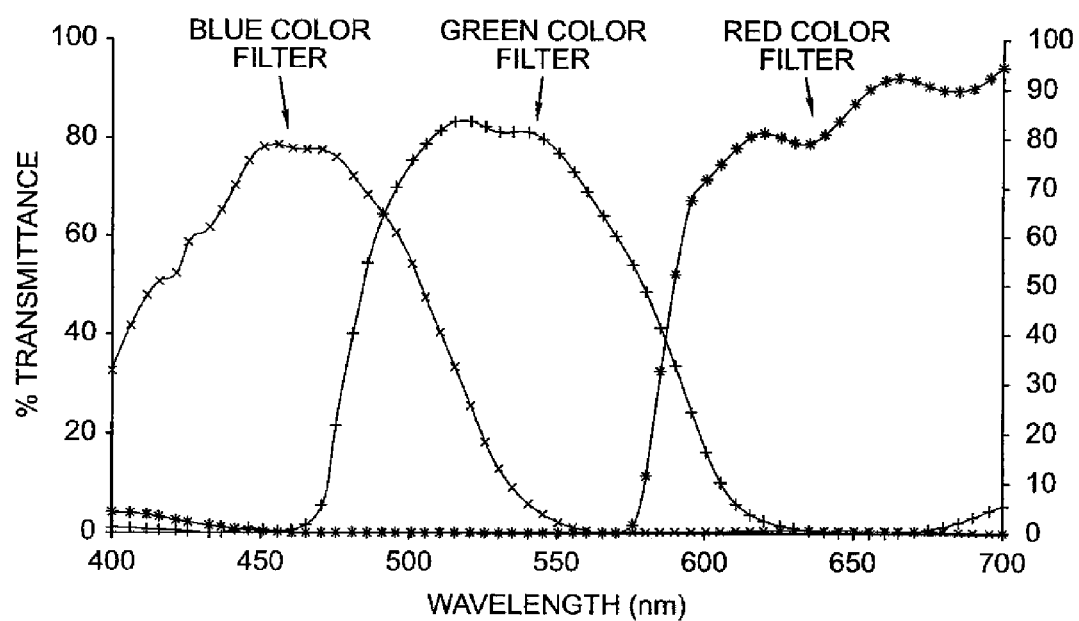
FIG. 4 shows the transmittance spectra of commercially available red, green, and blue color filters.

Regarding useful color filters, FIG. 4 shows the transmittance of commercially available red, green, and blue color filters. The blue color filter has maximum transmission of 80% and full width at half maximum (FWHM) 110 nm between 400-510 nm. The green color filter has maximum transmission of 85% and full width at half maximum (FWHM) 110 nm between 480-580 nm. Similarly, the red color filter has maximum transmission of 91% and full width at half maximum (FWHM) of greater than 110 nm between 590-700 nm. Color filters with different transmittance and bandwidth can also be used.

EXAMPLES

The present invention and its advantages are better appreciated by the following inventive and comparative examples. In the following, mixed compositions are described in terms of percentages by volume, as are commonly used in the art. After deposition of the OLED layers each device was then transferred to a dry box for encapsulation. The OLED has an emission area of 10 mm$^2$. The devices were tested by applying a current of 20 mA/cm$^2$ across electrodes. The performance of the devices is given in Table 1. Using the color filter spectra of FIG. 4 and the emission spectrum of each example, the color and efficiency of the filtered red, green and blue colors were calculated and provided in Table 2.

Composite Efficiency near D65 white point was obtained by taking the luminance efficiency and the color of the R, G, B components through the color filters. The individual color luminance contribution and the respective current density were calculated to obtain a certain luminance level near the D65 white point (in this case CIEx, y=0.31, 0.33). The total white luminance divided by the total current density gave the composite luminance efficiency at the white point. This composite efficiency is proportional to the power consumption for white emission at the white point. When the initial spectral emission has color-coordinated closer to D65, the power consumption is minimum. The color gamut for each device was calculated relative to the aim NTSC red, green, and blue color coordinates as measured in CIEx,y space.

| Aim NTSC CIE coordinates | | |
|---|---|---|
| Red | CIEx = 0.67 | CIEy = 0.33 |
| Green | CIEx = 0.21 | CIEy = 0.71 |
| Blue | CIEx = 0.14 | CIEy = 0.08 |

Examples 1-6 (Comparative)

Single Broadband EL Units

It is useful to begin with comparative OLEDs having only a single broadband EL unit. This makes the performance of tandem OLEDs having multiple EL units easier to understand.

Example 1 (Comparative)

Over a clean glass substrate, an 85 nm thick indium tin oxide (ITO) was provided. The ITO surface was treated with a plasma oxygen etch, followed by plasma deposition of a 0.5 nm layer of a fluorocarbon polymer (CFx) as described in U.S. Pat. No. 6,208,075. The following layers were deposited over CFx layer in the following sequence by evaporation from heated boats under a vacuum of approximately 10$^{-6}$ Torr:
a) a 60 nm thick HTL of 4,4'-bis[N-(1-naphthyl)-N-phenylamino]-biphenyl(NPB);
b) a 20 nm thick yellow light-emitting layer including 77% NPB (as host) with 3% yellow-orange emitting dopant as shown in Formula C7 and 20% anthracene derivative of formula AH3 as a stabilizer;
c) a 47 nm blue emitting layer including 93.5% AH3 host with 1.5% TBP (Formula H2) (as blue-emitting dopant) and 6% NPB;
d) a 25 nm thick EIL including 7.5% B-phen with 2.5% Li dopant; and
e) a cathode including 0.5 nm of LiF over the EIL to aid electron injection and 100 nm aluminum evaporated over the LiF.

Figure 5:
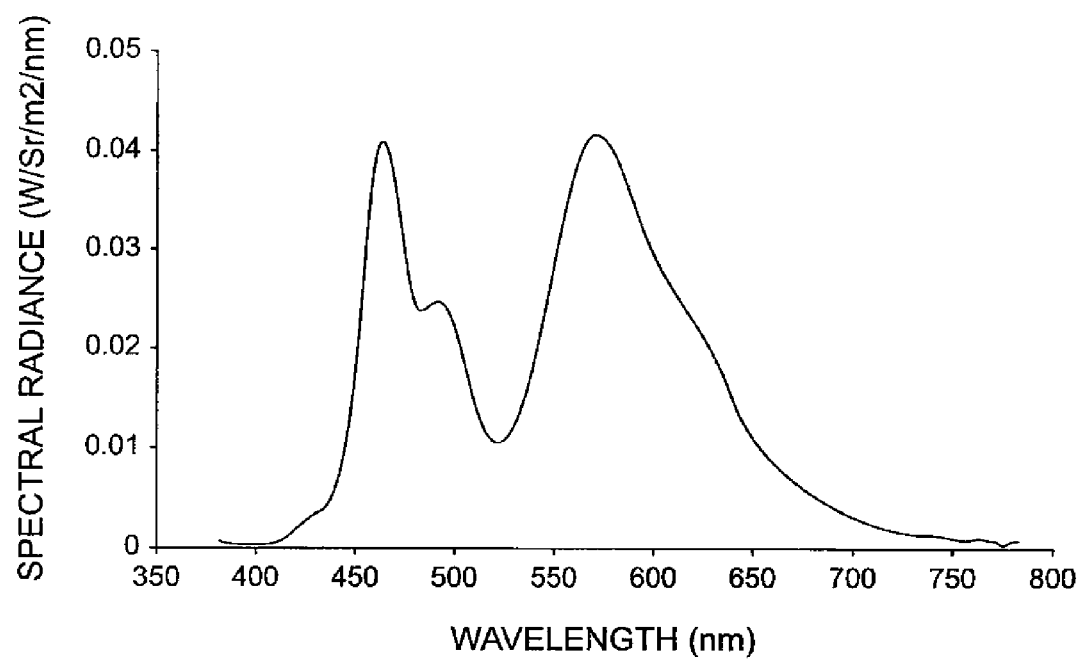
FIGS. 5-10 show the electroluminescence spectra of comparative OLED devices having a single broadband EL unit.

The emission spectrum is shown in FIG. 5.

Example 2 (Comparative)

Over a clean glass substrate, an 85 nm thick indium tin oxide (ITO) was provided. The ITO surface was treated with a plasma oxygen etch, followed by plasma deposition of a 0.5 nm layer of a fluorocarbon polymer (CFx) as described in U.S. Pat. No. 6,208,075. The following layers were deposited over CFx layer in the following sequence by evaporation from heated boats under a vacuum of approximately 10$^{-6}$ Torr:
a) a 240 nm thick HTL of NPB;
b) a 28 nm yellow light-emitting layer including 77% NPB (as host) with 3% yellow-orange emitting dopant as shown in Formula C7 and 20% anthracene derivative of formula AH3 as a stabilizer;
c) a 47 nm blue light-emitting layer including 92% AH3 host with 1% BEP (Formula F3) as blue-emitting dopant and 7% NPB;
d) a 10 nm thick ETL including ALQ; and
e) a cathode including 0.5 nm of LiF over the ETL to aid electron injection and 100 nm aluminum evaporated over the LiF.

Figure 6:
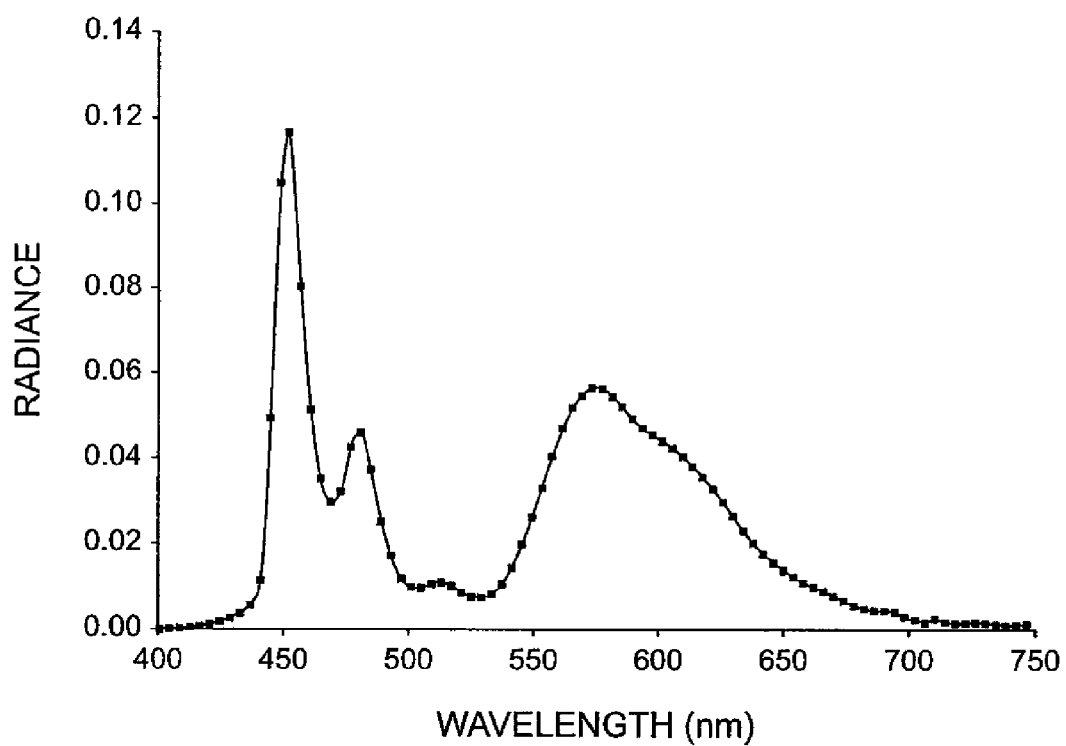

The emission spectrum for the device of Example 2 is shown in FIG. 6.

Example 3 (Comparative)

Over a clean glass substrate, an 85 nm thick indium tin oxide (ITO) was provided. The ITO surface was treated with a plasma oxygen etch, followed by plasma deposition of a 0.5 nm layer of a fluorocarbon polymer (CFx) as described in U.S. Pat. No. 6,208,075. The following layers were deposited over CFx layer in the following sequence by evaporation from heated boats under a vacuum of approximately 10$^{-6}$ Torr:

a) a 120 nm thick HTL of NPB;
b) a 20 nm red-orange light-emitting layer including 61% NPB (as host) with 28.5% rubrene and 0.5% red-emitting dopant (as shown in Formula A4);
c) a 38 nm blue light-emitting layer including AH3 host with 1% BEP (Formula F3) as blue emitting dopant and 7% NPB;
d) a 10 nm thick ETL including ALQ; and
e) a cathode including 0.5 nm of LiF over the ETL to aid electron injection and 100 nm aluminum evaporated over the LiF.

Figure 7:
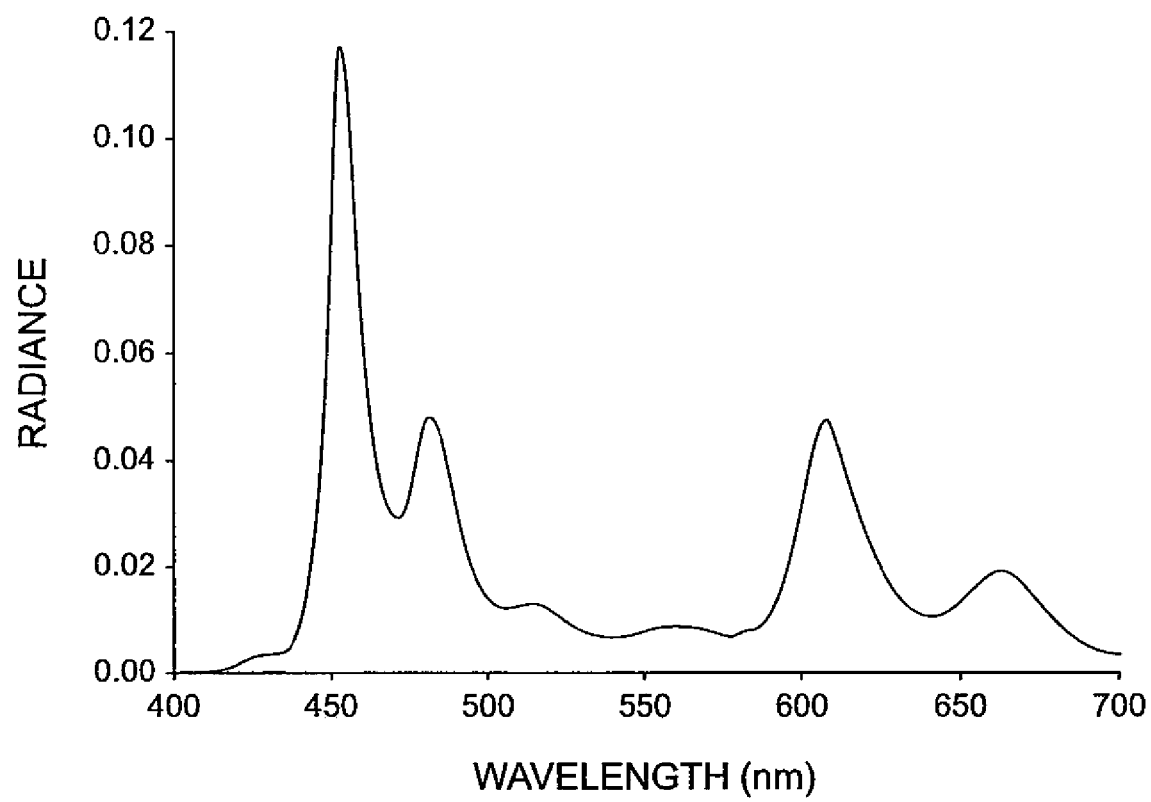

The emission spectrum is shown in FIG. 7.

Example 4 (Comparative)

Over a clean glass substrate, an 85 nm thick indium tin oxide (ITO) was provided. The ITO surface was treated with a plasma oxygen etch, followed by plasma deposition of a 0.5 nm layer of a fluorocarbon polymer (CFx) as described in U.S. Pat. No. 6,208,075. The following layers were deposited over CFx layer in the following sequence by evaporation from heated boats under a vacuum of approximately $10^{-6}$ Torr:

a) a 240 nm HTL of NPB;
b) a red-orange light-emitting layer including 59.5% NPB (as host) with 40% Rubrene and 0.5% red emitting dopant (as shown in Formula A4);
c) a 20 nm blue light-emitting layer including 92% AH3 blue host with 1% BEP (Formula F3) as blue emitting dopant and 7% NPB;
d) a 15 nm green light-emitting layer including 49.75% AH3, 49.75% ALQ and 0.5% Formula D4 as green emitting dopant;
e) a 10 nm ETL ALQ; and
f) a cathode including 0.5 nm of LiF over the ETL to aid electron injection and 100 nm aluminum evaporated over the LiF.

Figure 8:
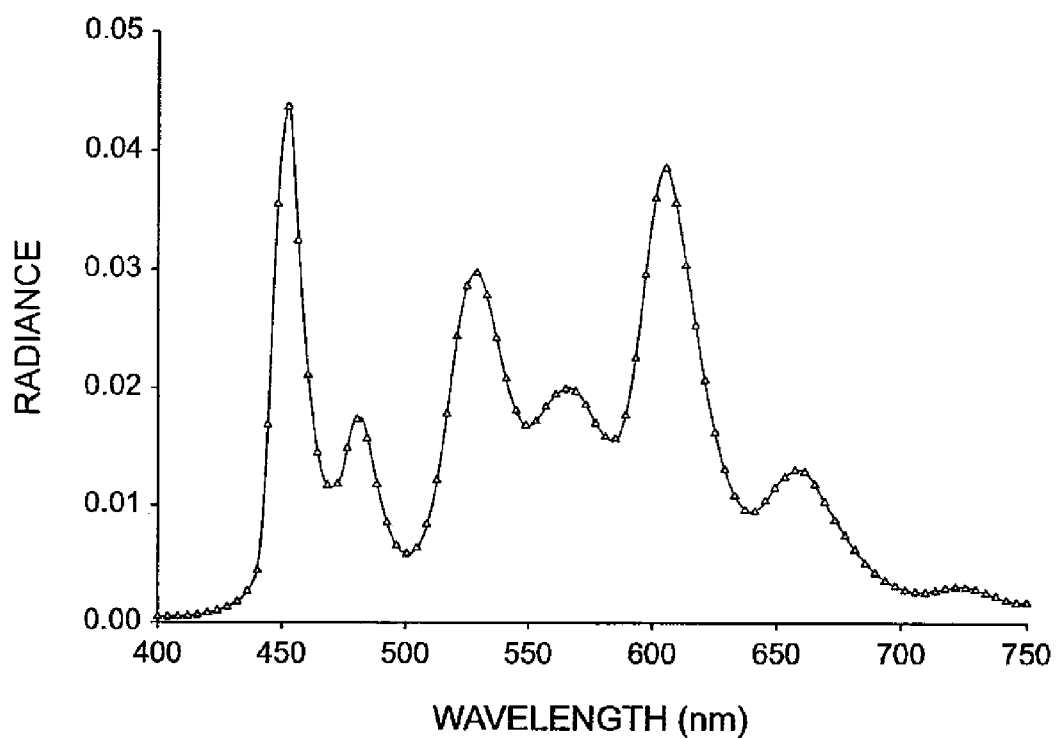

The emission spectrum is shown in FIG. 8.

Example 5 (Comparative)

Over a clean glass substrate, an 85 nm thick indium tin oxide (ITO) was provided. The ITO surface was treated with a plasma oxygen etch the following layers were deposited over oxygen plasma treated ITO in the following sequence by evaporation from heated boats under a vacuum of approximately $10^{-6}$ Torr:

a) a 10 nm HIL of Formula M1;
b) a 20 nm red-orange light-emitting layer including 94.5% NPB, 5% Formula C7 (yellow light-emitting dopant) and 0.5% Formula A4 (red emitting dopant);
c) a 20 nm blue light-emitting layer including 94% AH3 host with 1% BEP (Formula F3) as blue-emitting dopant and 5% NPB;
d) 2.5 nm ETL of Alq;
e) 40 nm EIL, including 49% 4,7-diphenyl-1,10-phenanthroline (also known as bathophen or Bphen), 49% Alq as co-host electron-transporting and 2% Li metal; and
f) a 100 nm thick aluminum cathode.

Figure 9:
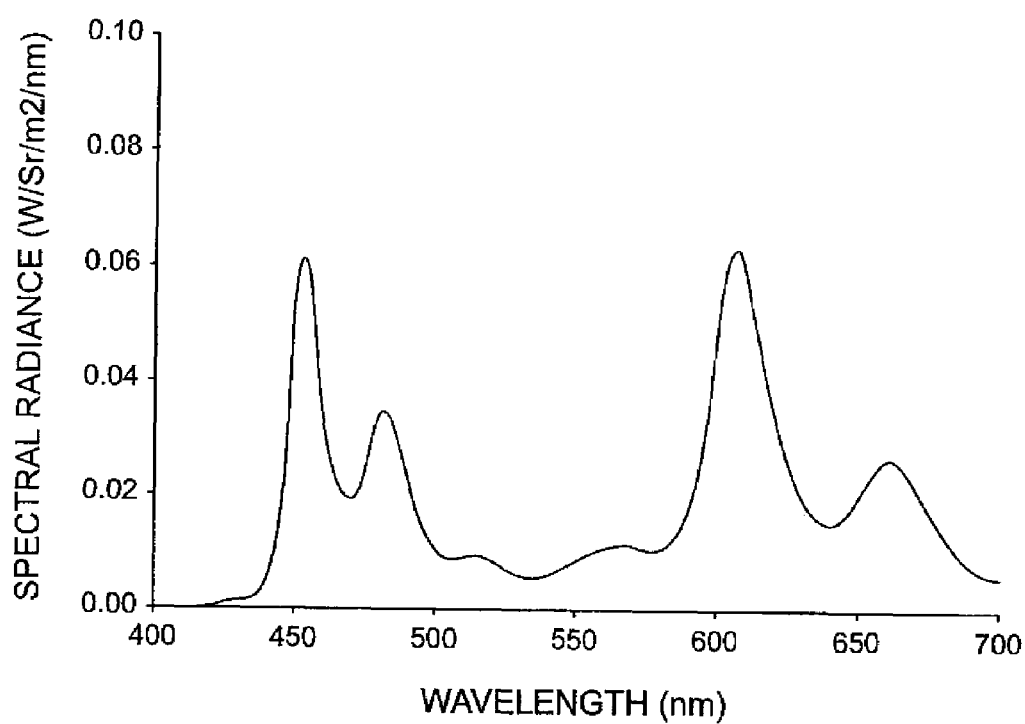

The emission spectrum is shown in FIG. 9.

Example 6 (Comparative)

Over a clean glass substrate, an 85 nm thick indium tin oxide (ITO) was provided. The ITO surface was treated with a plasma oxygen etch the following layers were deposited over oxygen plasma treated ITO in the following sequence by evaporation from heated boats under a vacuum of approximately $10^{-6}$ Torr:

a) a 10 nm HIL of Formula M1;
b) a 20 nm red light-emitting layer including 99.5% NPB and 0.5% Formula A4 as the red emitting dopant;
c) a 20 nm green light-emitting layer including 49.75% AH3, 49.75% ALQ and 0.5% Formula D4 as green emitting dopant;
d) a 20 nm blue light-emitting layer including 94% AH3, 1% BEP (Formula F3) as blue emitting dopant and 5% NPB;
e) 2.5 nm ETL of ALQ;
f) 40 nm EIL, including 49% 4,7-diphenyl-1,10-phenanthroline (also known as bathophen or Bphen), 49% Alq as co-host electron-transporting and 2% Li metal; and
g) a 100 nm thick aluminum cathode.

Figure 10:
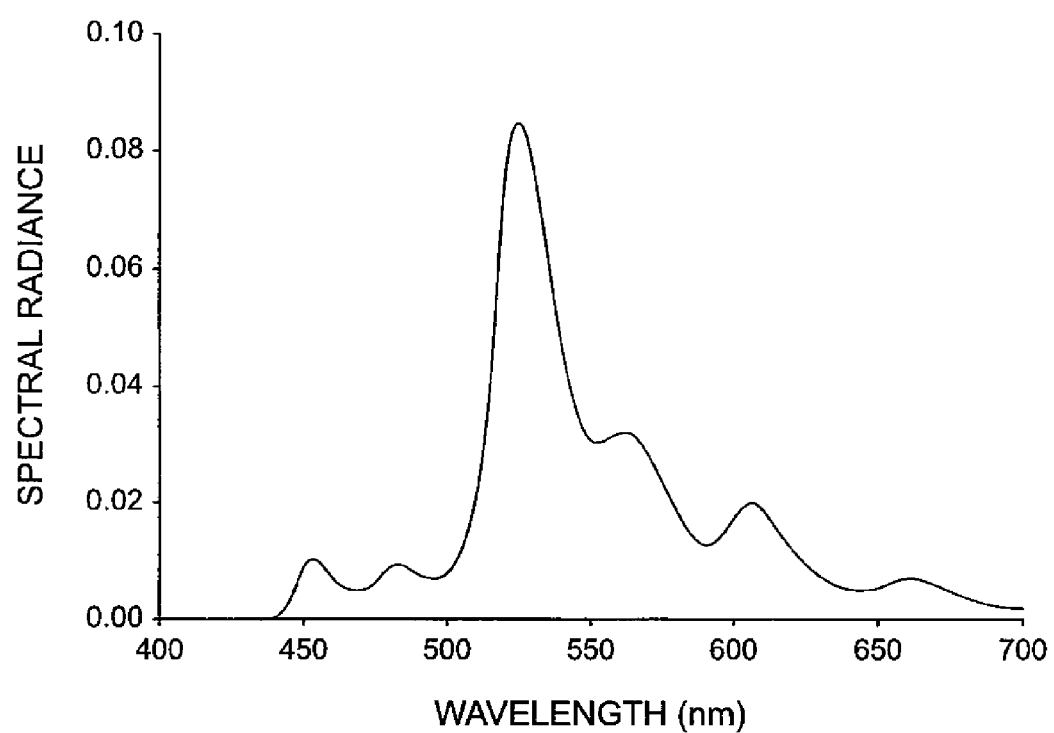

The emission spectrum is shown in FIG. 10.

Examples 7-10 Illustrate Tandem OLED Devices

Example 7 (Comparative)

Over a clean glass substrate, an 85 nm thick indium tin oxide (ITO) was provided. The ITO surface was treated with a plasma oxygen etch, followed by plasma deposition of a 0.5 nm layer of a fluorocarbon polymer (CFx) as described in U.S. Pat. No. 6,208,075. The following layers were deposited over CFx layer in the following sequence by evaporation from heated boats under a vacuum of approximately $10^{-6}$ Torr:

First Broadband EL Unit
a) a 10 nm HIL of Formula M1;
b) a 60 nm HTL of NPB;
c) a 20 nm yellow light-emitting layer including 77% NPB (as host) with 3% yellow-orange emitting dopant as shown in Formula C7 and 20% anthracene derivative of formula AH3 as a stabilizer;
d) a 47 nm blue emitting layer including 92.5% AH3 host with 1.5% TBP (Formula H2) as blue emitting dopant and 6% NPB;

Intermediate Connector
e) 25 nm thick n-type doped organic layer, including 49 volume % Bphen and 49 volume % Alq as the electron-transporting materials co-deposited and doped with 2% by volume Li metal;
f) 10 nm electron accepting layer of Formula M1;

Second Broadband EL Unit;
g) a 120 nm HTL of NPB;
h) a 20 nm yellow light-emitting layer including 77% NPB (as host) with 3% yellow-orange emitting dopant as shown in Formula C7 and 20% anthracene derivative of formula AH3 as a stabilizer;
i) a 47 nm blue light-emitting layer including 92.5% AH3 host with 1.5% TBP (Formula H2) as blue emitting dopant and 6% NPB;
j) 25 nm thick EIL including 49% Bphen and 49% Alq as the electron-transporting materials co-deposited with 2% Li metal; and
k) a 200 nm thick aluminum cathode.

Figure 11:
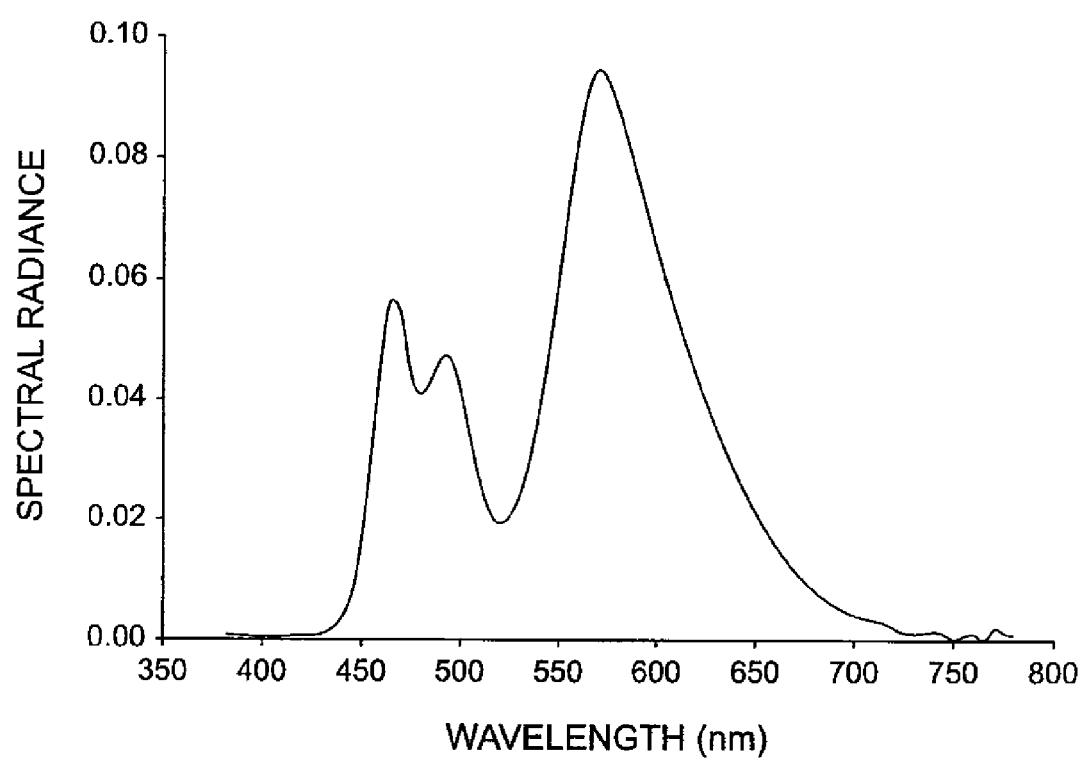
FIG. 11 shows the electroluminescence spectrum of a comparative tandem OLED device.

The emission spectrum of this device, shown in FIG. 11.

Example 8 (Inventive)

Over a clean glass substrate, an 85 nm thick indium tin oxide (ITO) was provided. The ITO surface was treated with a plasma oxygen etch the following layers were deposited over oxygen plasma treated ITO in the following sequence by evaporation from heated boats under a vacuum of approximately $10^{-6}$ Torr:

First Broadband EL Unit
- a) a 10 nm HIL of Formula M1;
- b) 20 red light-emitting layer including 99.5% NPB doped with 0.5% of Formula A4;
- c) a 20 nm blue light-emitting layer including 94% AH3, 1% blue light-emitting dopant (Formula F3) and 5% NPB;

Intermediate Connector
- d) 40 nm thick n-type doped organic layer, including 49% Bphen and 49% Alq as the electron-transporting materials co-deposited and doped with 2% Li metal;
- e) 10 nm electron accepting layer of Formula M1;

Second Broadband EL Unit;
- f) an HTL, 40 nm thick, including NPB;
- g) a red-orange light-emitting layer including 20 nm of NPB doped with 5% yellow light-emitting dopant (formula C7) and with 0.5% red emitting dopant (as shown in Formula A4);
- h) a 20 nm green emitting layer including 49.75% AH3, 49.75% ALQ as co-host with 0.5% Formula D4 as green emitting dopant;
- i) 10 nm a blue light-emitting layer including 94% AH3, 1% blue light-emitting dopant (Formula F3) and 5% NPB;
- j) 40 nm thick EIL, including 49% Bphen and 49% Alq as electron-transporting materials co-deposited with 2% Li metal; and
- k) a 200 nm thick aluminum cathode.

Figure 12:
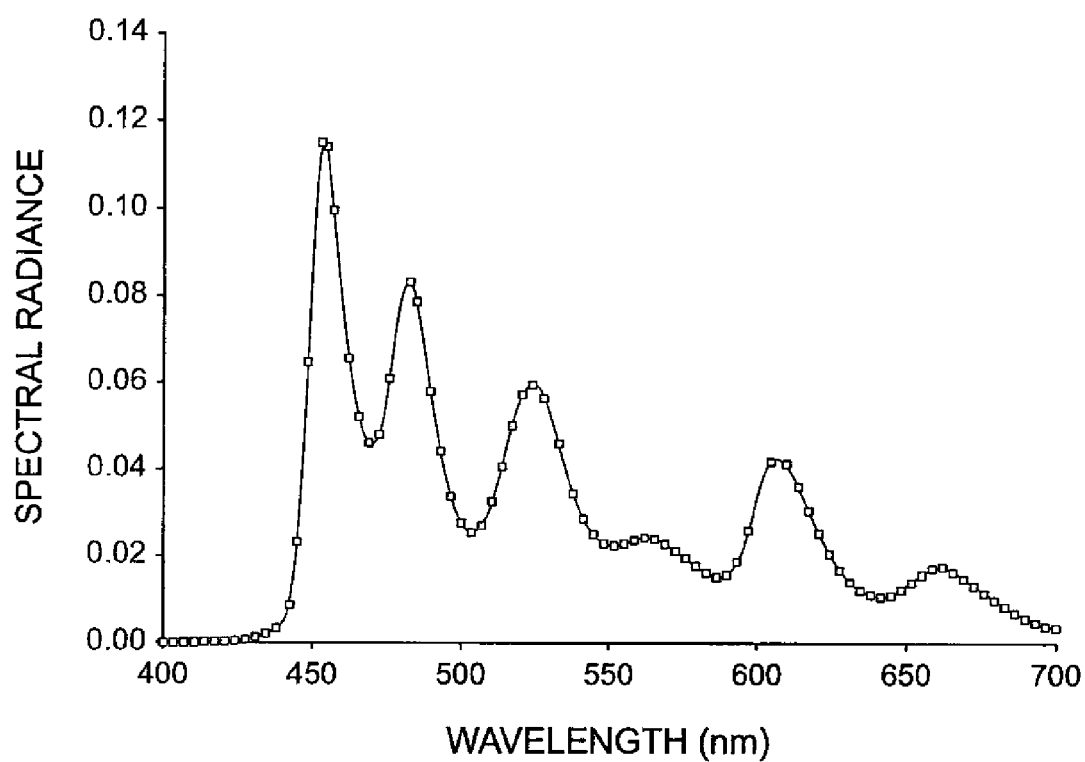
FIGS. 12-14 show the electroluminescence spectra of tandem OLED devices of the present invention.

The emission spectrum of this device, shown in FIG. 12.

Example 9 (Inventive)

Over a clean glass substrate, an 85 nm thick indium tin oxide (ITO) was provided. The ITO surface was treated with a plasma oxygen etch the following layers were deposited over oxygen plasma treated ITO in the following sequence by evaporation from heated boats under a vacuum of approximately $10^{-6}$ Torr:

First Broadband EL Unit
- a) a 10 nm HIL of Formula M1;
- b) a 20 nm red light-emitting layer including 79.5% of NPB doped with 0.5% red emitting dopant (as shown in Formula A4) and 20% AH3 as a stabilizer;
- c) a 20 nm blue light-emitting layer including 93% AH3, 2% blue light-emitting dopant (Formula F3) and 5% NPB;

Intermediate Connector
- d) 80 nm thick n-type doped organic layer, including 49% Bphen and 49% Alq as the electron-transporting materials co-deposited with 2% by volume Li metal;
- e) 10 nm electron accepting layer of Formula M1;

Second Broadband EL Unit
- f) a 20 nm red-orange light-emitting layer including 94.5% NPB, 5% yellow light-emitting dopant (formula C7) and 0.5% red emitting dopant (as shown in Formula A4);
- g) a 20 nm green light-emitting layer including 49.75% AH3, 49.75% ALQ and 0.5% Formula D4 as green emitting dopant;
- h) 10 nm a blue light-emitting layer including AH3, 1% blue light-emitting dopant (Formula F3) and 5% NPB;
- i) 40 nm thick EIL, including 49% Bphen and 49% Alq as electron-transporting materials co-deposited with 2% Li metal; and
- j) a 200 nm thick aluminum cathode.

Figure 13:
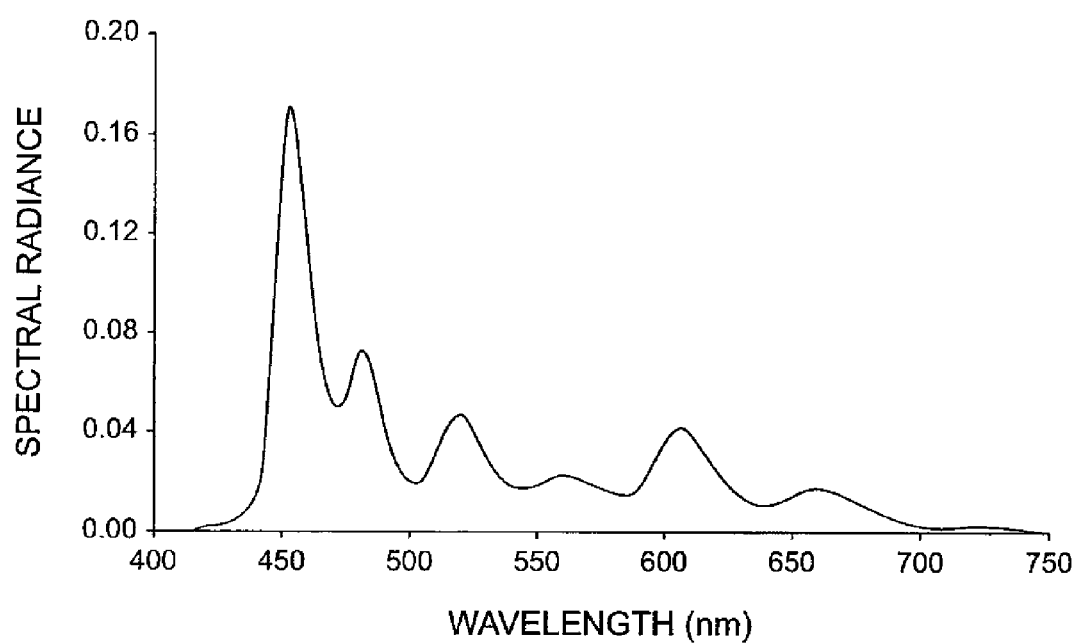

The emission spectrum of this device, shown in FIG. 13.

Example 10 (Inventive)

Over a clean glass substrate, an 85 nm thick indium tin oxide (ITO) was provided. The ITO surface was treated with a plasma oxygen etch the following layers were deposited over oxygen plasma treated ITO in the following sequence by evaporation from heated boats under a vacuum of approximately $10^{-6}$ Torr:

First Broadband EL Unit
- a) a 10 nm HIL of Formula M1;
- b) 60 nm HTL of NPB;
- c) a 20 nm red-orange light-emitting layer including 94.5% NPB, 5% yellow light-emitting dopant (formula C7) and 0.5% red emitting dopant (as shown in Formula A4);
- d) a 20 nm green emitting layer including 92.5% AH3, 7% NPB and 0.5% Formula D4 as green emitting dopant;
- e) a 10 nm a blue light-emitting layer including 92% AH3, 1% blue light-emitting dopant volume (Formula F3) and 7% NPB;

Intermediate Connector
- f) a 40 nm thick n-type doped organic layer, including 49% nm Bphen and 49% nm Alq as the electron-transporting materials co-deposited and doped with 2% by volume Li metal;
- g) a 10 nm electron accepting layer of Formula M1;

Second Broadband EL Unit
- h) a 64 nm HTL of NPB;
- i) a 20 nm thick red light-emitting layer including 79.5% NPB, 0.5% red emitting dopant (as shown in Formula A4) and 20% AH3 as a stabilizer;
- j) a 20 nm blue light-emitting layer including 92% AH3, 1% blue light-emitting dopant (Formula F3) and 7% NPB;
- k) a 40 nm thick EIL including 49% Bphen and 49% Alq as electron-transporting materials co-deposited with 2% Li metal; and
- l) a 200 nm thick aluminum cathode deposited over the EIL.

Figure 14:
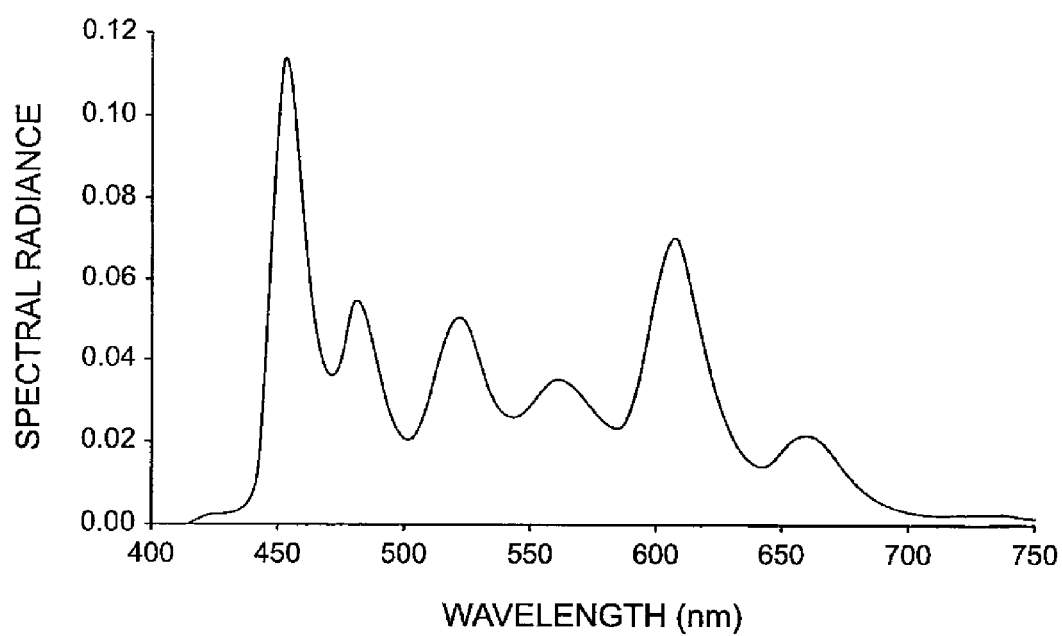

The emission spectrum of this device, shown in FIG. 14.

TABLE 1

Electroluminescence data measured at 20 mA/cm²

|  | Drive Voltage (Volts) | Luminance efficiency (cd/A) | Color: CIEx | Color: CIEy |
|---|---|---|---|---|
| Example 1 (Comparative) | 5.3 | 9.6 | 0.36 | 0.37 |
| Example 2 (Comparative) | 9.8 | 11.7 | 0.35 | 0.30 |
| Example 3 (Comparative) | 8.0 | 5.7 | 0.30 | 0.21 |
| Example 4 (Comparative) | 9.6 | 7.2 | 0.36 | 0.37 |
| Example 5 (Comparative) | 4.6 | 6.2 | 0.39 | 0.27 |
| Example 6 (Comparative) | 5.6 | 11.0 | 0.32 | 0.57 |
| Example 7 (Comparative) | 9.5 | 20.3 | 0.40 | 0.41 |
| Example 8 (Inventive) | 9.6 | 11.3 | 0.27 | 0.31 |

TABLE 1-continued

Electroluminescence data measured at 20 mA/cm²

|  | Drive Voltage (Volts) | Luminance efficiency (cd/A) | Color: CIEx | Color: CIEy |
|---|---|---|---|---|
| Example 9 (Inventive) | 9.1 | 10.9 | 0.27 | 0.27 |
| Example 10 (Inventive) | 9.9 | 13.0 | 0.31 | 0.31 |

TABLE 2

Device data simulated though color filters of FIG. 4

| | Performance through Red filter | | | Performance through Green filter | | | Performance through Blue filter | | | | Color |
|---|---|---|---|---|---|---|---|---|---|---|---|
| | Lum Efficiency (cd/A) | CIEx | CIEy | Lum Efficiency (cd/A) | CIEx | CIEy | Lum Efficiency (cd/A) | CIEx | CIEy | Composite Efficiency at D65 (cd/A) | Gamut: NTSC ratio (%) |
| Example 1 (Comparative) | 1.9 | 0.64 | 0.36 | 5.0 | 0.34 | 0.56 | 0.8 | 0.13 | 0.11 | 2.28 | 56 |
| Example 2 (Comparative) | 2.8 | 0.64 | 0.36 | 5.4 | 0.37 | 0.53 | 0.8 | 0.14 | 0.06 | 3.48 | 52 |
| Example 3 (Comparative) | 2.0 | 0.66 | 0.34 | 2.2 | 0.26 | 0.48 | 0.9 | 0.14 | 0.07 | 1.98 | 57 |
| Example 4 (Comparative) | 1.6 | 0.65 | 0.35 | 3.7 | 0.30 | 0.62 | 0.6 | 0.14 | 0.12 | 1.68 | 69 |
| Example 5 (Comparative) | 2.6 | 0.66 | 0.34 | 2.2 | 0.32 | 0.49 | 0.6 | 0.13 | 0.08 | 1.85 | 53 |
| Example 6 (Comparative) | 1.1 | 0.64 | 0.36 | 7.5 | 0.25 | 0.69 | 1.2 | 0.11 | 0.41 | 0.85 | 49 |
| Example 7 (Comparative) | 2.2 | 0.64 | 0.36 | 11.0 | 0.36 | 0.58 | 1.1 | 0.12 | 0.19 | 2.93 | 51 |
| Example 8 (Inventive) | 2.0 | 0.65 | 0.34 | 6.4 | 0.22 | 0.58 | 1.9 | 0.13 | 0.12 | 3.18 | 69 |
| Example 9 (Inventive) | 2.2 | 0.65 | 0.34 | 6.0 | 0.22 | 0.56 | 2.0 | 0.13 | 0.11 | 3.39 | 67 |
| Example 10 (Inventive) | 3.1 | 0.65 | 0.34 | 6.6 | 0.27 | 0.54 | 1.5 | 0.13 | 0.10 | 3.8 | 67 |

Comparative Examples 1-6 show that it is difficult to achieve both effective composite efficiency and effective color gamut. Examples 1 and 2 have reasonably effective composite efficiency but low color gamut. Example 4 has effective color gamut, but the composite efficiency is degraded relative to Examples 1 and 2. Example 6 shows an example of a broadband that is very far from D65 white. Although there are spaced spectral components corresponding to each color filter, their intensities are too low to provide either effective composite efficiency or color gamut.

The broadband EL units used in comparative tandem device of Example 7 are similar to the broadband device of Example 1. By producing a tandem device, the overall luminance efficiency of the unfiltered device doubles (Table 1) and the composite efficiency of the filtered device also increases, but not by 2× (Table 2). Further, Example 7 has low color gamut. Referring to FIG. 11, this device does not provide spaced peak spectral components corresponding to each color filter of FIG. 4. That is, only the blue filter receives spaced peak spectral component having a full width at half maximum that is within its band pass. The green and red filters do not.

In the present invention, improved composite efficiency and improved color gamut are achieved by coating two broadband EL units that have different spectral features. In this way, spaced peak spectral components are provided corresponding to each color filter of FIG. 4. Referring to FIGS. 11-14, each color filter receives a spaced peak spectral component having a full width at half maximum that is within its band pass. Further, such spectral components have substantial intensity. Note that in the case of Example 10 (FIG. 14), the spectral component having an emission peak at 520 nm overlaps with that having a peak at 560 nm. However, these spaced spectral components are sufficiently separate that one can clearly see that, in the absence of the 560 nm peak, the 520 nm peak would have a full width at half maximum within the band pass of the green color filter. A dotted line is provided that estimates the individual 520 nm spectral component. Even without referring to the dotted line estimate, one can clearly see that the width of the 520 nm spectral component is within the green filter band pass at approximately half of its maximum intensity.

The tandem devices prepared according to the present invention also show improved stability over the single EL unit devices.

The invention has been described in detail with particular reference to certain preferred embodiments thereof, but it will be understood that variations and modifications can be effected within the spirit and scope of the invention.

| PARTS LIST | |
|---|---|
| 100 | tandem OLED display |
| 105 | color filter |
| 105a | red filter |
| 105b | green filter |
| 105c | blue filter |
| 110 | anode |
| 110a | anode |
| 110b | anode |
| 110c | anode |
| 120.1 | broadband light-emitting unit |
| 120.2 | broadband light-emitting unit |

-continued

PARTS LIST

| | |
|---|---|
| 120.x | broadband light-emitting unit |
| 120.N | broadband light-emitting unit |
| 120.(N-1) | broadband light-emitting unit |
| 130.1 | intermediate connector |
| 130.x | intermediate connector |
| 130.(N-1) | intermediate connector |
| 150 | substrate |
| 170 | cathode |
| 300 | emission spectrum |
| 305 | peak spectral component |
| 310 | full width at half maximum |
| 315 | band pass |
| 320 | transmittance spectrum |
| 325 | peak spectral component |
| 330 | transmittance spectrum |
| 335 | band pass |
| 400 | light-emitting pixel |
| 410 | hole-injecting layer |
| 420 | hole-transporting layer |
| 425 | hole-transporting layer |
| 430 | light-emitting layer |
| 435 | light-emitting layer |
| 450 | light-emitting layer |
| 455 | light-emitting layer |
| 460 | electron-transporting layer |
| 465 | electron-transporting layer |
| 475 | electron-injecting layer |

The invention claimed is:

1. A tandem OLED device having at least two spaced electrodes comprising:
   a) at least two broadband light-emitting units disposed between the electrodes that produce different emission spectra and each light-emitting unit produces light that has two or more spaced peak spectral components;
   b) an intermediate connector disposed between each of the light-emitting units; and
   c) an array of at least three different color filters associated with the device that receives light from the broadband light-emitting units, the band pass of each of the color filters being selected to produce different colored light, and wherein one or more individually addressable pixels is not filtered.
   wherein the full width at about half maximum of at least one of such spaced peak spectral components produced by each emitting unit is within the band pass of a color filter, and wherein each of the at least three different color filters receives at least one spaced peak spectral component having a full width at about half maximum that is within its band pass.

2. The tandem OLED device of claim 1 wherein the device is a full color display having an array of individually addressable pixels associated with the array of color filters.

3. The tandem OLED device of claim 2 wherein the color filters are red, green, and blue.

4. The tandem OLED device of claim 1 wherein the individually addressable pixels each emit red, green, blue, or white light.

5. The tandem OLED device of claim 1 wherein a first broadband light-emitting unit produces two spaced peak spectral components and a second broadband light-emitting unit produces two spaced peak spectral components such that at least one of the spaced spectral components of the second broadband light-emitting unit is different than that of the first.

6. The tandem OLED device of claim 5 wherein a first broadband light-emitting unit produces blue and red spaced peak spectral components and a second broadband light-emitting unit produces blue and green spaced peak spectral components.

7. The tandem OLED device of claim 6 wherein the second broadband light-emitting unit further produces one or more red spaced peak spectral component(s).

8. The tandem OLED device of claim 1 wherein the relative radiance intensifies of such spaced peak spectral components received by each color filter are within a factor of 4 of each other.

9. The tandem OLED device of claim 1 wherein at least one peak spectral component is between 600 and 640 nm and has a full width at half maximum of 40 nm or less.

10. The tandem OLED device of claim 1 wherein at least one peak spectral component is between 510 and 540 nm and has a full width at half maximum of 40 nm or less.

11. The tandem OLED device of claim 1 wherein at least one peak spectral component is between 450 and 480 nm and has a full width at half maximum of 20 nm or less.

12. The tandem OLED device of claim 1 having three broadband light-emitting units.

* * * * *

UNITED STATES PATENT AND TRADEMARK OFFICE
CERTIFICATE OF CORRECTION

PATENT NO.         : 7,531,959 B2
APPLICATION NO.    : 11/170681
DATED              : May 12, 2009
INVENTOR(S)        : Tukaram K. Hatwar et al.

It is certified that error appears in the above-identified patent and that said Letters Patent is hereby corrected as shown below:

Column 43, line 42     delete "filtered." and insert --filtered;--

Column 44, line 29     delete "intensifies" and insert --intensities--

Signed and Sealed this

Twenty-fifth Day of August, 2009

David J. Kappos
*Director of the United States Patent and Trademark Office*